United States Patent
Fukuda

(10) Patent No.: US 10,886,448 B2
(45) Date of Patent: Jan. 5, 2021

(54) METHOD FOR PRODUCING LEAD FRAME, METHOD FOR PRODUCING PACKAGE AND METHOD FOR PRODUCING LIGHT EMITTING DEVICE

(71) Applicant: NICHIA CORPORATION, Anan (JP)

(72) Inventor: Mayumi Fukuda, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/794,593

(22) Filed: Feb. 19, 2020

(65) Prior Publication Data

US 2020/0185583 A1 Jun. 11, 2020

Related U.S. Application Data

(60) Continuation of application No. 16/017,583, filed on Jun. 25, 2018, now Pat. No. 10,600,944, which is a (Continued)

(30) Foreign Application Priority Data

Aug. 7, 2015 (JP) .................................. 2015-157219

(51) Int. Cl.
*H01L 21/48* (2006.01)
*H01L 33/62* (2010.01)
(Continued)

(52) U.S. Cl.
CPC ............ *H01L 33/62* (2013.01); *H01L 33/486* (2013.01); *H01L 33/502* (2013.01); (Continued)

(58) Field of Classification Search
CPC .................................................. H01L 21/4842
See application file for complete search history.

(56) References Cited

U.S. PATENT DOCUMENTS

2008/0012036 A1 1/2008 Loh et al.
2008/0121921 A1 5/2008 Loh et al.
(Continued)

FOREIGN PATENT DOCUMENTS

CN 203859145 U 10/2014
CN 203967129 U 11/2014
(Continued)

OTHER PUBLICATIONS

Restriction Requirement of the U.S. Appl. No. 15/225,227, dated Sep. 22, 2017.
(Continued)

*Primary Examiner* — Peniel M Gumedzoe
*Assistant Examiner* — Christopher A Johnson
(74) *Attorney, Agent, or Firm* — Global IP Counselors, LLP

(57) ABSTRACT

A method for producing a lead frame includes press-punching a metal sheet to form the lead frame such that a radius of curvature at a corner of a lower face of each of electrodes is larger than a radius of curvature at a corner of an upper face of each of the electrodes while a radius of curvature at a corner of a lower face of each of hanger leads is smaller than a radius of curvature at a corner of an upper face of each of the hanger leads. The lead frame includes the electrodes, the hanger leads spaced apart from the electrodes, and an outer frame attached to the electrodes and the hanger leads. The lead frame partially defines a box-shaped package that defines a first recess having an opening defining by the support member and a bottom face at least partially formed by the electrodes.

10 Claims, 15 Drawing Sheets

Related U.S. Application Data division of application No. 15/225,227, filed on Aug. 1, 2016, now Pat. No. 10,032,972.

(51) Int. Cl.
  *H01L 33/48* (2010.01)
  *H01L 33/50* (2010.01)
  *H01L 33/00* (2010.01)
  *H01L 33/56* (2010.01)

(52) U.S. Cl.
  CPC .......... *H01L 33/0095* (2013.01); *H01L 33/56* (2013.01); *H01L 2224/48091* (2013.01); *H01L 2224/48247* (2013.01); *H01L 2224/48257* (2013.01); *H01L 2933/005* (2013.01); *H01L 2933/0033* (2013.01); *H01L 2933/0041* (2013.01); *H01L 2933/0066* (2013.01)

(56) References Cited

U.S. PATENT DOCUMENTS

| | | |
|---|---|---|
| 2011/0198739 A1 | 8/2011 | Amanai et al. |
| 2011/0233579 A1 | 9/2011 | Loh et al. |
| 2012/0012879 A1 | 1/2012 | Loh et al. |
| 2012/0025361 A1 | 2/2012 | Ito et al. |
| 2012/0115261 A1 | 5/2012 | Kwon |
| 2012/0205712 A1 | 8/2012 | Hayashi |
| 2013/0299854 A1 | 11/2013 | Lee et al. |
| 2014/0203304 A1 | 7/2014 | Kim et al. |
| 2016/0064633 A1 | 3/2016 | Park et al. |

FOREIGN PATENT DOCUMENTS

| | | |
|---|---|---|
| JP | 07-297346 A | 10/1995 |
| JP | 2008-072092 A | 3/2008 |
| JP | 2008-182242 A | 8/2008 |
| JP | 2010-186896 A | 8/2010 |
| JP | 2011-103437 A | 5/2011 |
| JP | 3168024 U | 5/2011 |
| JP | 2011-233928 A | 11/2011 |
| JP | 2012-028699 A | 2/2012 |
| JP | 2012-039162 A | 2/2012 |
| JP | 2013-051296 A | 3/2013 |
| JP | 2013-077813 A | 4/2013 |
| JP | 2013-161903 A | 8/2013 |
| JP | 2013-183013 A | 9/2013 |
| JP | 2013-239708 A | 11/2013 |
| JP | 2014-203889 A | 10/2014 |
| JP | 2015-005584 A | 1/2015 |

OTHER PUBLICATIONS

Ex Parte Quayle Action of the U.S. Appl. No. 15/225,227, dated Dec. 15, 2017.

Notice of Allowance of the U.S. Appl. No. 15/225,227, dated Mar. 26, 2018.

Non Final Office Action of the U.S. Appl. No. 16/017,583, dated Jun. 20, 2019.

Notice of Allowance of the U.S. Appl. No. 16/017,583, dated Nov. 14, 2019.

METHOD FOR PRODUCING LEAD FRAME, METHOD FOR PRODUCING PACKAGE AND METHOD FOR PRODUCING LIGHT EMITTING DEVICE

CROSS-REFERENCE TO RELATED APPLICATIONS

This application is a continuation application of U.S. patent application Ser. No. 16/017,583 filed on Jun. 25, 2018, which is a divisional application of U.S. patent application Ser. No. 15/225,227 filed on Aug. 1, 2016, now U.S. Pat. No. 10,032,972. The present application claims priority under 35 U.S.C. § 119 to Japanese Patent Application No. 2015-157219, filed Aug. 7, 2015, entitled "Lead frame, package, light emitting device, and method for producing the same". The contents of U.S. patent application Ser. Nos. 16/017,583 and 15/225,227 and Japanese Patent Application No. 2015-157219 are incorporated herein by reference in their entirety.

BACKGROUND

The present disclosure relates to lead frames, packages, light emitting devices, and methods for producing the same.

Up to this time, lead frames having hanger leads, packages using such lead frames, and light emitting devices having semiconductor light emitting elements installed in such packages have been known as shown, for example, in Japanese Unexamined Patent Application Publication No. 2012-28699 and Japanese Registered Utility Model Publication No. 3168024.

Packages are formed by applying resin molding or the like to lead frames made of multiple sets of electrodes and hanger leads attached to the outer frames. Electrodes are supported by resin support members, and the resin support members are supported by multiple hanger leads attached to the outer frames of the lead frames at the lateral faces so that the packages will not be scattered when the electrodes are separated from the outer frames. This produces a package assemblage in which a plurality of packages are attached to the outer frames by the hanger leads.

Moreover, individual packages can be detached from the assemblage by separating the support members from the hanger leads by pushing the packages out in the direction perpendicular to the outer frame surfaces of the lead frames.

SUMMARY

Lead frames are manufactured by press-punching or etching a metal sheet as described, for example, in Japanese Unexamined Patent Application Publication No. 2012-28699. Press-punching particularly is a highly efficient method, but the metal sheet surface on the punch side of the punching machine becomes a "dull face" having rounded edges, while the metal plate surface on the die side becomes a "burred face" having burrs along the edges.

If the packages are formed so that the burred faces of the lead frames are oriented to face away from the support members and thus are exposed, the burrs generated along the edges of the burred faces of the electrodes can damage other members or cause floating when mounting the devices. In order to avoid this, the lead frames are oriented so that the edges of their burred faces are covered by the support members. Accordingly, the lead frames are positioned to have their dull faces face away from the support members.

At this point, the hanger leads formed in the lead frames are positioned so that their dull faces also face away from the support members. The hanger leads are disposed so that their tips bite into the lateral faces of the support members, which will be separated therefrom when the packages are separated into individual pieces.

Here, a package produced by a comparative method will be explained with reference to FIGS. 11A and 11B. FIG. 11A is a sectional view showing the structure of a comparative package supported by hanger leads. FIG. 11B is a sectional view showing the comparative package separated from the hanger leads.

In the comparative package 1001, in order to achieve good mountability, the lead frame 1003 is positioned so that the burred face becomes the upper face and the burrs generated on the electrode 1031 are not exposed at the lower face 1012 which is the mounting face. The support member 1002 which supports the electrode 1031 is formed by resin molding. The members of the lead frame 1003, such as the electrode 1031 and the hanger leads 1035, are formed by press-punching from the same side using a comparative punching process. The hanger leads 1035 thus are also formed with the burred face up and the dull face down.

Resin molding the support member 1002 results in the tips 1351 of the hanger leads 1035 biting into the outer lateral faces 1021b and 1021d of the support member 1002. Since the lower corner 1035e of the dull face of a hanger lead 1035 is rounded, the resin penetrates the space between the flat upper face of the lower die of the resin mold and the dull or rounded portion. As a result, the lower face 1012 of the package 1001, which is composed of the lower face 1031b of the electrode 1031 and the lower face 1021e of the support member 1002, is formed as a flat face.

By applying a pressing force from the lower face side of the package 1001, the tips 1351 of the hanger leads 1035 are detached from the support member 1002 to separate the package 1001. This creates recesses 1024 at the positions where the hanger leads 1035 were once located on the outer lateral faces 1021b and 1021d of the support member 1002. The resin which had penetrated the dull portions are turned over when the hanger leads 1035 are separated as the packages are separated into individual pieces to become projecting resin burrs 1027. Such resin burrs 1027 might adversely affect the adhesion of the package 1001 to a circuit board during mounting, reducing the mountability.

Certain embodiments of the present disclosure aim to provide lead frames which allow for the production of packages and light emitting devices with good mountability, packages, light emitting devices, and the method for producing the same.

A method for producing a lead frame according to one embodiment of the present disclosure includes press-punching a metal sheet to form the lead frame such that a radius of curvature at a corner of a lower face of each of electrodes is larger than a radius of curvature at a corner of an upper face of each of the electrodes while a radius of curvature at a corner of a lower face of each of hanger leads is smaller than a radius of curvature at a corner of an upper face of each of the hanger leads. The lead frame includes the electrodes, the hanger leads spaced apart from the electrodes, and an outer frame attached to the electrodes and the hanger leads, the lead frame partially defining a box-shaped package, which has a first recess for mounting a light emitting element, as combined with a support member made of a resin for supporting the electrodes, the first recess having an opening defining by lateral walls formed by the support member and a bottom face at least partially formed by the electrodes.

A method for producing a package according to one embodiment of the present disclosure includes: forming the lead frame by the method as described above; interposing the lead frame between an upper die and a lower die of a molding die, which are configured to move in an up-down motion and has a cavity for forming the lateral walls; injecting a first resin into the molding die interposing the lead frame; and curing or solidifying the first resin injected in the molding die, wherein during the interposing of the lead frame, burred faces of the electrodes face the cavity, edges of the electrodes are placed in an area where the cavity is disposed in a plan view, and tips of the hanger leads are placed in the area where the cavity is disposed in the plan view.

A method for producing a light emitting device according to one embodiment of the present disclosure includes: forming the package by the method as described above; and mounting the light emitting element in the first recess of the package.

According to the lead frame, the package, the light emitting device, and the production methods for the same of the embodiments of the present disclosure, packages and light emitting devices having good mountability can be produced.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION

Figure 1:
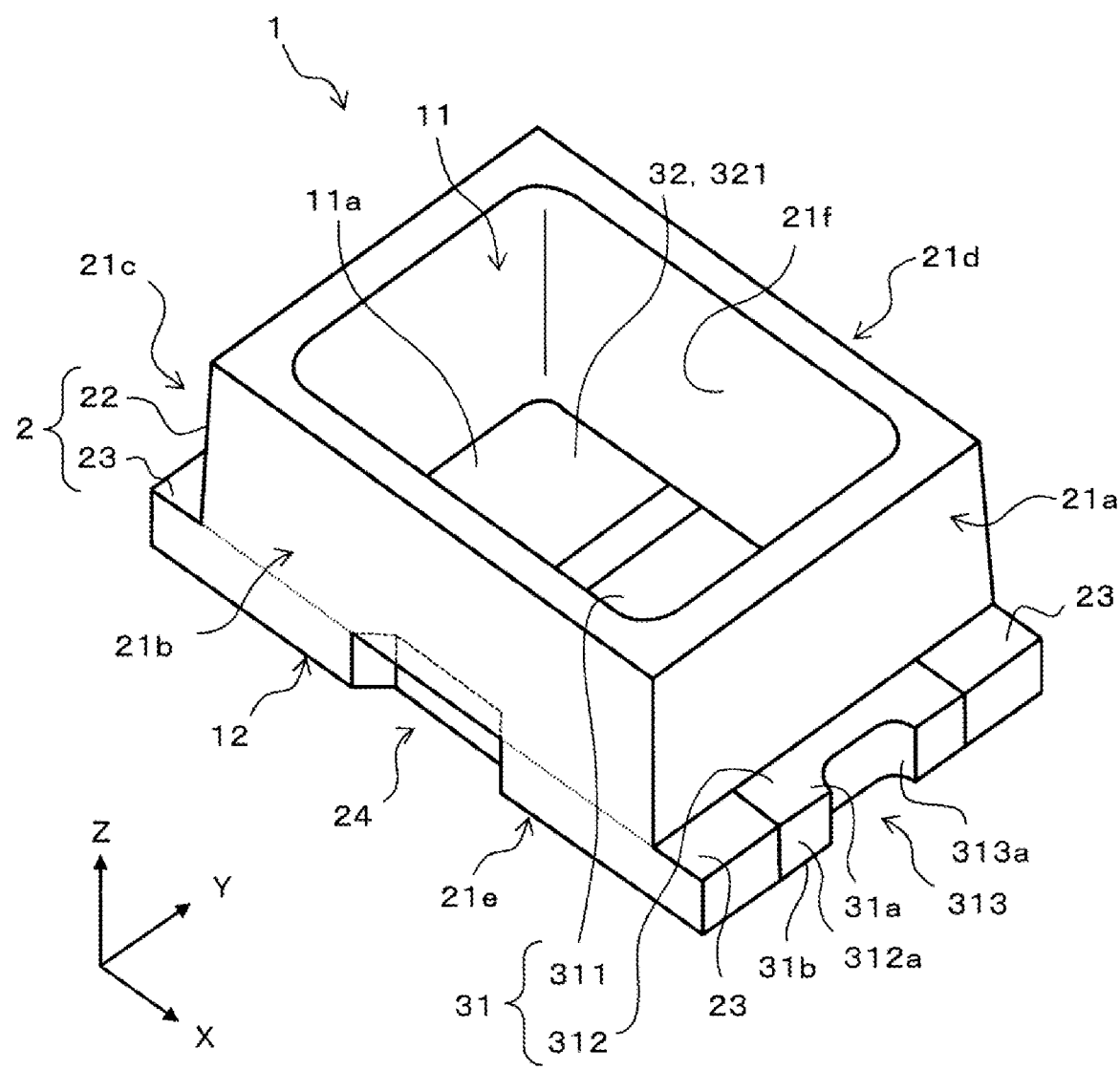
FIG. 1 is a perspective view showing the package structure according to Embodiment 1.

The embodiments will now be described with reference to the accompanying drawings, wherein like reference numerals designate corresponding or identical elements throughout the various drawings.

The lead frame, the package, the light emitting device, and the methods for producing the same according to certain embodiments will be explained below. The drawings referenced in the explanation are schematic representation of the embodiments, and thus the scale, spacing, positional relationship of the members may be exaggerated, or the members may be partially omitted. In the explanation below, the members referred to by the same names or denoted by the same reference numerals represent the same members or those of a similar nature as a rule, for which the explanations will be omitted when appropriate.

For the sake of convenience, the directions of observation are indicated by using XYZ coordinate axes.

Embodiment 1

Package Structure

The structure of the package according to Embodiment 1 will be explained with reference to FIG. 1 to FIG. 2C.

Figure 2A:
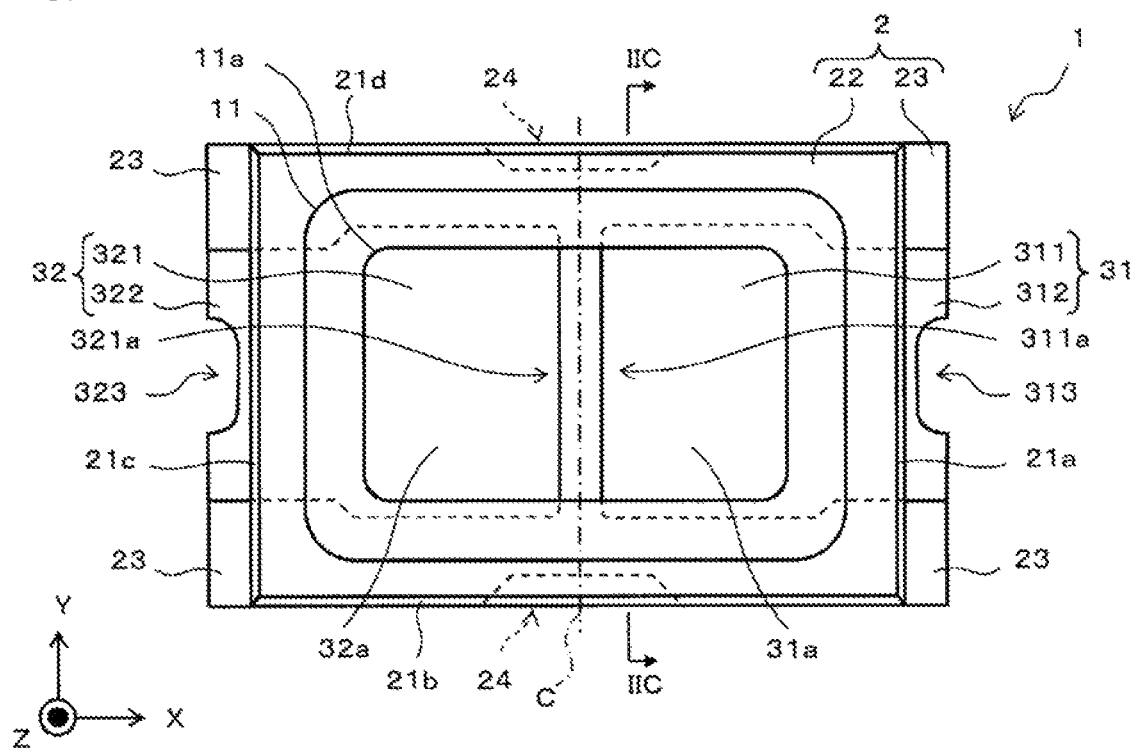
FIG. 2A is a plan view showing the package structure according to Embodiment 1.
Figure 2B:
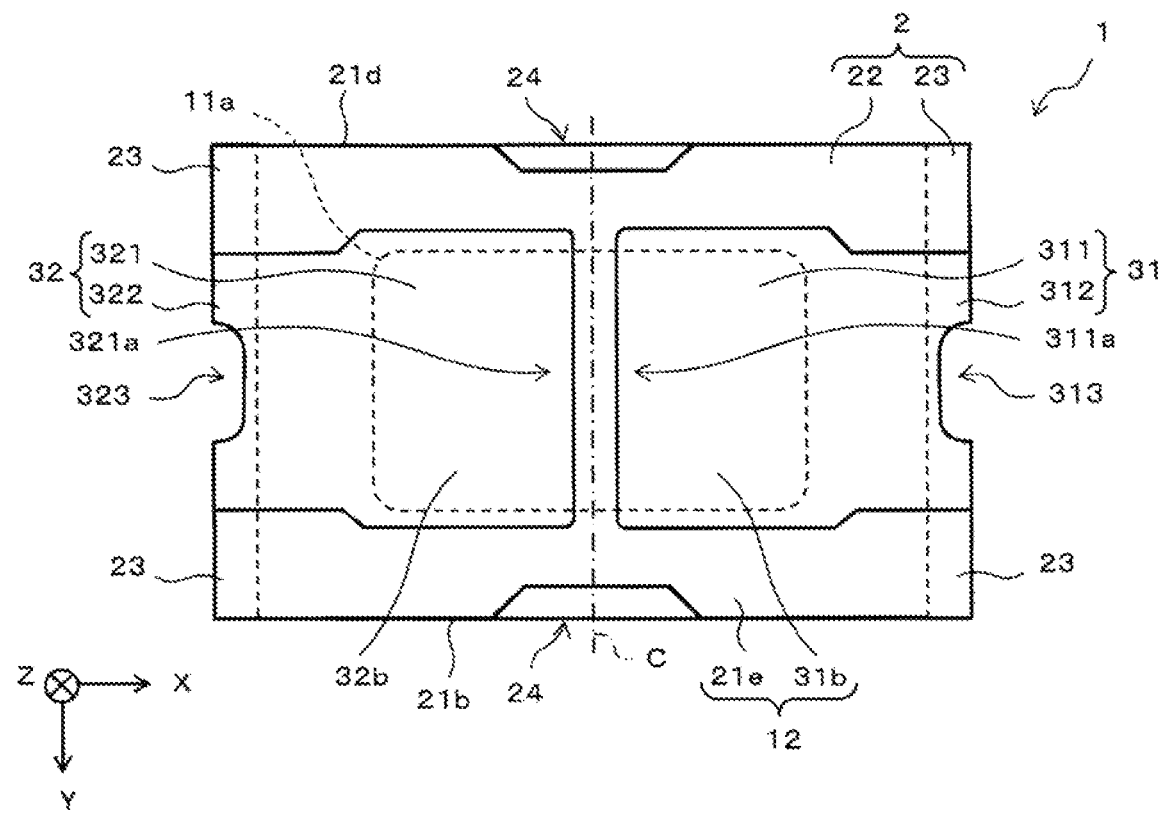
FIG. 2B is a bottom view showing the package structure according to Embodiment 1.
Figure 2C:
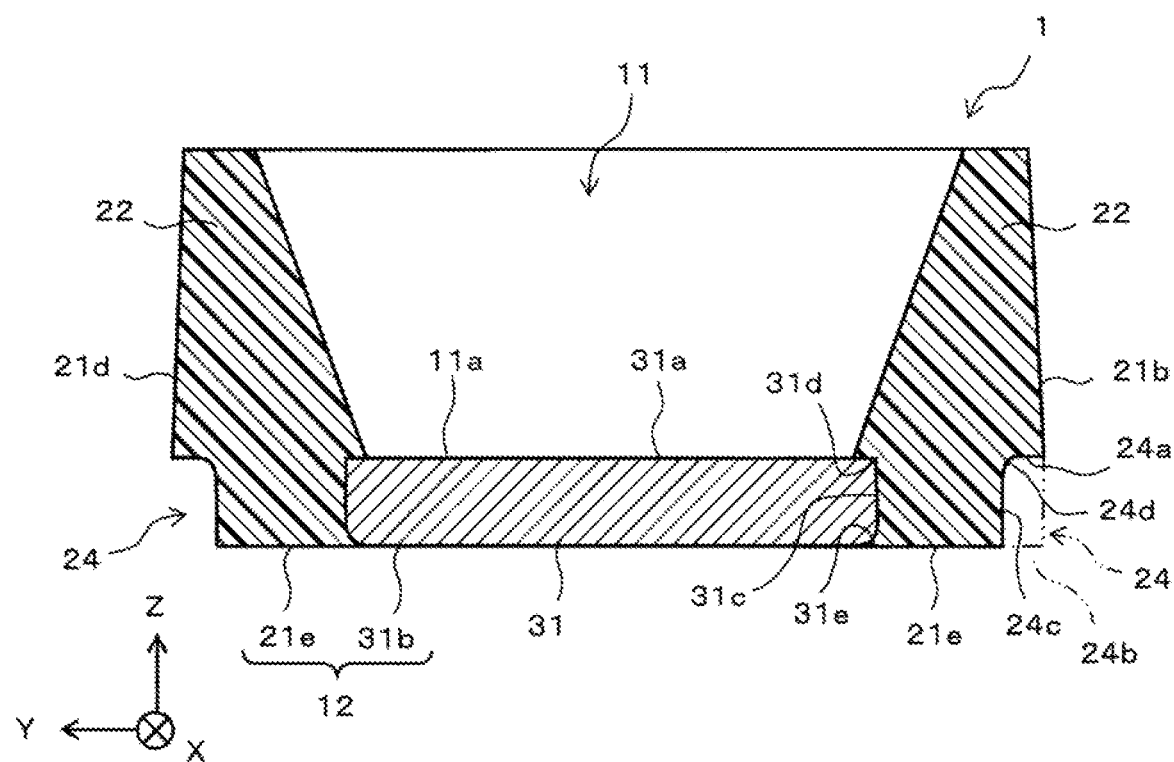
FIG. 2C is a sectional view showing the package structure according to Embodiment 1 along line IIC-IIC indicated in FIG. 2A.

FIG. 1 is a perspective view showing the package structure according to Embodiment 1. FIG. 2A is a plan view of the package structure according to Embodiment 1, and FIG. 2B is a bottom view of the package according to Embodiment 1. FIG. 2C is a sectional view along line IIC-IIC indicated in FIG. 2A showing the package structure according to Embodiment 1.

The package 1 of Embodiment 1 has an overall shape of a parallelepiped, and is box-shaped with a first recess 11 which is open at the top. Here, a box shape refers to a hollow shape, and in this embodiment, the package 1 is cup-shaped and is open at the top. In a plan view, the shape of the cup which is open at the top is substantially rectangular with rounded corners, but it can be also be circular, elliptical, polygonal, or the like. The package 1 includes a first electrode 31, a second electrode 32 having a different polarity from that of the first electrode 31, and a support member 2 for supporting the first electrode 31 and the second electrode 32.

The first recess 11 is a cavity for mounting a light emitting element 4. The lateral faces of the first recess 11 are surrounded by the walls 22 of the support member 2, and the bottom face 11a is formed by the first electrode 31, the second electrode 32, and the support member 2. In other words, at least some portions of the bottom face 11a of the first recess 11 are composed of the inner lead portion 311 of the first electrode 31 and the inner lead portion 321 of the second electrode 32. The first recess 11, moreover, is shaped so as to widen towards the open end, in the +z direction. The lower faces 31b and 32b of the first electrode 31 and the second electrode 32 are exposed at the lower face 12 of the package 1, which form the mounting face for mounting the package 1 on a substrate or the like. Moreover, the lower faces 31b and 32b of the first electrode 31 and the second electrode 32 and the lower face 21e which is the lower end face of the support member 2 are formed to be coplanar, i.e., the lower face 12 of the package 1 is formed to be flat.

In each drawing, the coordinate axes are set so that the lower face 12 which is the mounting face of the package 1 is a plane in parallel with the XY plane. The first direction in which the end 311a of the first electrode 31 opposes the end 321a of the second electrode 32 is the X-axis direction, and the second direction which is perpendicular to the first direction is the Y-axis direction. The direction perpendicular to the mounting face, the height direction of the package 1, is the Z-axis direction.

The support member 2 includes walls 22 and collars 23. The support member 2 can be formed by molding a resin material.

The walls 22 secure the first electrode 31 and the second electrode 32, as well as structuring the lateral walls that surround the lateral faces of the first recess 11. The walls 22 have a first outer lateral face 21a, a second outer lateral face 21b which is adjacent to the first outer lateral face 21a, a third outer lateral face 21c which is adjacent to the second outer lateral face 21b and opposes the first outer lateral face 21a, and a fourth outer lateral face 21d which is adjacent to the first outer lateral face 21a and the third outer lateral face 21c.

The first outer lateral face 21a, the second outer lateral face 21b, the third outer lateral face 21c, and the fourth outer lateral face 21d are perpendicular to the lower face 21e up to the heights of the upper faces of the first electrode 31 and the second electrode 32, and are inwardly oblique beyond the heights towards the top in the +Z direction.

The first outer lateral face 21a, the second outer lateral face 21b, the third outer lateral face 21c, and the fourth outer lateral face 21d may be entirely perpendicular or oblique.

The inner lateral faces 21f of the walls 22 which structure the lateral faces of the first recess 11 are outwardly oblique from the bottom face 11a towards the open end. The inner lateral faces 21f may be perpendicular faces, but are preferably outwardly oblique faces. Making them oblique allows for the light emitted by the light emitting element mounted in the first recess 11 and propagating transversely to be reflected towards the open end, thereby increasing the light extraction efficiency.

The collars 23 are provided so as to project outwardly from the first outer lateral face 21a and the third outer lateral face 21c of the walls 22 in a plan view. The collars 23 are provided on both sides of each of the outer lead portions 312 and 322 in a plan view with the same thickness as the outer lead portions 312 and 322. The walls 22 and the collars 23 are integrally formed using the same material. Because they are integrally molded, the bonding strength between the walls 22 and the collars 23 can be increased.

The collars 23 can alternatively be provide on both sides or one side of one of the outer lead portions 312 and 322, or may be omitted.

In the package 1, the first electrode 31 projects from the first outer lateral face 21a and the second electrode 32 projects from the third outer lateral face 21c, but neither the first electrode 31 nor the second electrode 32 projects from the second outer lateral face 21b or the fourth outer lateral face 21d. In other words, the entire second outer lateral face 21b and the entire fourth outer lateral face 21d are formed of the same material, i.e., a resin, as that of the walls 22. Thus, the solder wettability is low when the package 1 is soldered to an external mounting substrate, for example, thereby reducing solder wetting onto the second outer lateral face 21b and the fourth outer lateral face 21d.

In the package 1, the second outer lateral face 21b and the fourth outer lateral face 21d are each provided with a second recess 24 substantially in the center in the first direction, the X-axis direction, in which the tip 311a of the first electrode 31 and the tip 321a of the second electrode 32 oppose one another. The second recesses 24 are created by cutting off or indenting a portion of the lower face 21e of the support member 2 at the lower end of the second outer lateral face 21b and the fourth outer lateral face 21d.

The size of the second recesses 24 is not limited, but the width in the X-axis direction is preferably in a range between 500 μm and 700 μm, particularly preferably in a range between 600 μm and 650 μm, and the depth in the Y-axis direction is preferably in a range between 20 μm and 90 μm, particularly preferably in a range between 40 μm and 60 μm. The height of the second recesses 24 in the Z-axis direction is the same as the height (i.e., thickness) of the lead frame 3.

The second recesses 24 are where the two hanger leads preformed in the lead frame used for producing the package 1 once were. In the case where the lead frame 3 shown in FIGS. 5A and 5B, for example, is used in producing the package 1, the second recesses 24 would have the same shapes as the tips 351 of the hanger leads 35. The details will be described later, but the hanger leads 35 are formed so that the upper outer edges are rounded, and the lower outer edges are not rounded.

The second recesses 24 each has a columnar outer shape having a trapezoid bottom face in a plan view, which is tapered towards the central portion of the support member 2.

The second recesses 24 are each an area surrounded by the upper face 24a (the lower face of the support member 2), the lateral face 24c, the lower face 24b which is a virtual extension of the lower face 21e of the support member 2, and a virtual extension of the second outer lateral face 21b (or the fourth outer lateral face 21d) of the support member 2. The inner edges at the upper end of the second recesses 24, which are the upper face corners 24d connecting the upper face 24a and the lateral faces 24c, are rounded.

Examples of the resin materials (first resin) used for the support member 2 include thermoplastic resins and thermosetting resins.

In the case of thermoplastic resins, for example, polyphthalamide resins, liquid crystal polymers, polybutylene terephthalate (PBT), unsaturated polyester, or the like, can be used.

In the case of a thermosetting resin, for example, epoxy resins, modified epoxy resins, silicone resins, modified silicone resins, or the like, can be used.

The support member 2 may contain particles of a light reflecting substance so that light is efficiently reflected at the inner lateral faces 21f of the walls 22 of the support member 2. The light reflecting substance is a material providing high light reflectance at the external faces, including white fillers, such as titanium oxide, glass fillers, silica, alumina, zinc oxide, or the like, when contained in a resin material. The inner lateral faces 21f preferably have reflectance of at least 70%, more preferably at least 80%, relative to visible light. Particularly, they preferably have reflectance of at least 70%, more preferably at least 80%, in the wavelength range of the light emitted from the light emitting element.

The content of the light reflecting substance in the resin material can be, without limitation, in a range between 5 percent by mass and 50 percent by mass, preferably in a range between 10 percent by mass and 30 percent by mass.

The first electrode 31, one of the pair of electrodes, is structured with an inner lead 311 disposed in the area where the walls 22 are disposed or on the inner side of the walls 22, and an outer lead 312 disposed on the outer side of the walls 22 in a plan view.

The second electrode 32, the other of the pair of electrodes, has the same shape as, and is substantially symmetrical to the first electrode 31 across the center line C in the first direction, X-axis direction, in a plan view. The first electrode 31 and the second electrode 32 are formed in substantially the same thickness in whole.

The inner lead 311 of the first electrode 31, in a plan view, is disposed in the area that is on the inner side of the outer edges of the walls 22, and is used to electrically connect the light emitting element by die bonding or/and solder or wire. The inner lead 311, in a plan view, is substantially oblong, but the width on the outer side in X-axis direction is smaller than the width on the inner side, towards the center.

The outer lead 312 of the first electrode 31 is disposed so as to project from the first outer lateral face 21a of the support member, and in the same width as the outer side of the inner lead 311 in X-axis direction. Collars 23 having the same thickness are provided at both ends of the outer lead 312 in the second direction, Y-axis direction, and a third recess 313 is created at the end in the X-axis direction. The third recess 313 has no collar 23.

In order to increase the light reflectance or/and the adhesion to a conductive bonding material such as solder, the upper face 31a and the lower face 31b of the first electrode 31 are plated with a single layer or multilayer of Ag, Au, or Ni. The end face 312a of the outer lead 312 is not plated, but the end face 313a of the third recess 313 is plated. Thus, when bonding the third recess 313 to an external mounting substrate using solder, for example, the solder creeps up the lateral face 313a to form a solder fillet, improving the bonding strength. Moreover, whether the solder bonding is good or not can be checked by observing the presence or absence of the solder fillet.

The metal used for plating can vary depending on the purpose of plating, in other words, depending on the area to be plated. For example, Ag may be used for the upper face 31a to primarily increase light reflectance, and Au may be used for the lower face 31b and the lateral face 313a to primarily enhance the bonding with solder.

Since the inner lead 321, the outer lead 322, and the third recess 323 of the second electrode 32 are similar to the inner lead 311, the outer lead 312, and the third recess 313 of the first electrode 31, the explanation will be omitted.

As for the third recesses 313 and 323, it suffices to dispose only one of the two, or it is also fine to dispose neither. The third recesses 313 and 323 can be shaped in any given way. It may also be fine not to provide the collars 23 and the outer leads 312, 322 projecting from the walls 22 described above.

The shape of the third recesses 313 and 323 is not particularly limited, but is preferably a semispherical, semielliptical, or semi-oval shape in a plan view. In the case of a semielliptical or semi-oval shape, the ratio of the short diameter to the long diameter is preferably in a range between 10:11 and 10:80, more preferably in a range between 10:15 and 10:60. For example, the long diameter of a semielliptical or semi-oval shape can be in a range of 160 and 320 μm relative to the short diameter of 50 μm.

The outer edges on the lower face side of the first electrode 31, i.e., the lower face corners 31e connecting the lower face 31b and the lateral faces 31c, in a plan view, are rounded. The outer edges on the upper face side of the first electrode 31, i.e., the upper face corners 31d connecting the upper face 31a and the lateral faces 31c are not rounded. The outline of the first electrode 31 is formed by press-punching in the production method described later, and the burred face of the steel sheet after press-punching is used as the upper face 31a, and the dull face as the lower face 31b.

Here, the lower face corners 31e "being rounded" means that the radius of curvature at these corners is larger as compared to the upper face corners 31d which are not rounded. This is also true for the second electrode 32 and the hanger lead 35.

Since the shapes of the upper face edges and the lower face edges of the second electrode 32 are similar to those of the first electrode 31, the explanation will be omitted.

Method for Producing Package

Figure 3:
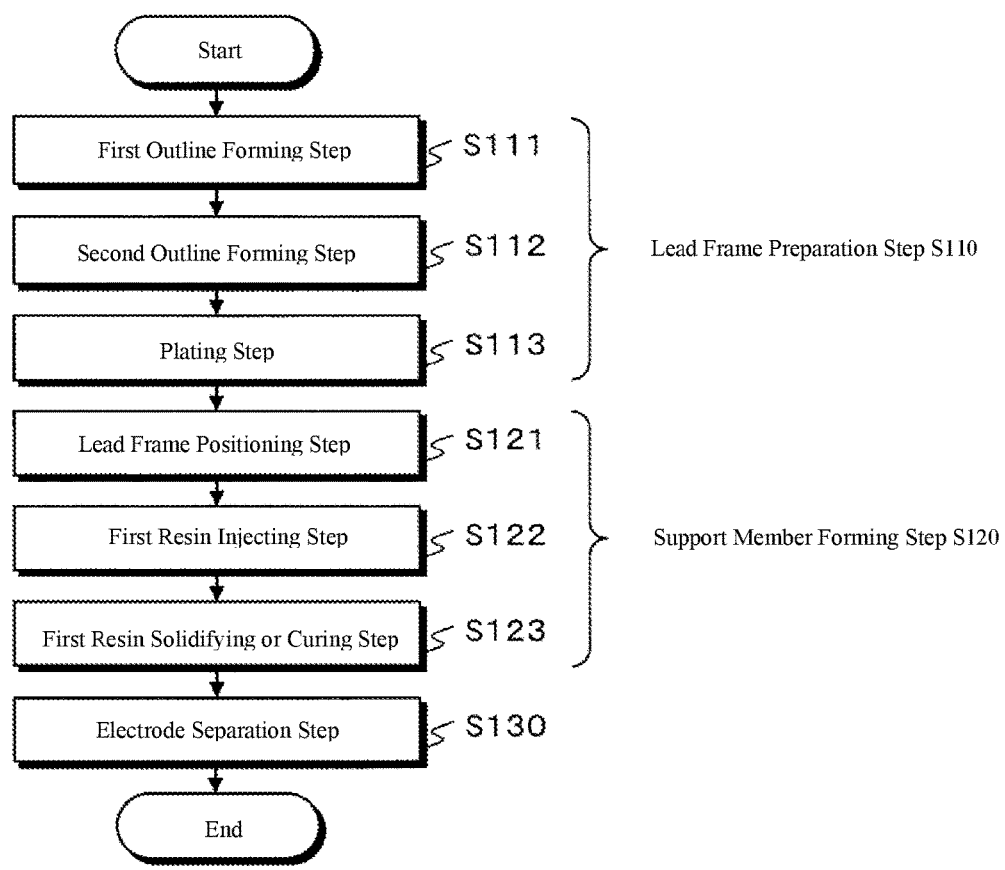
FIG. 3 is a flowchart showing the steps of the production method for the package according to Embodiment 1.
Figure 4A:
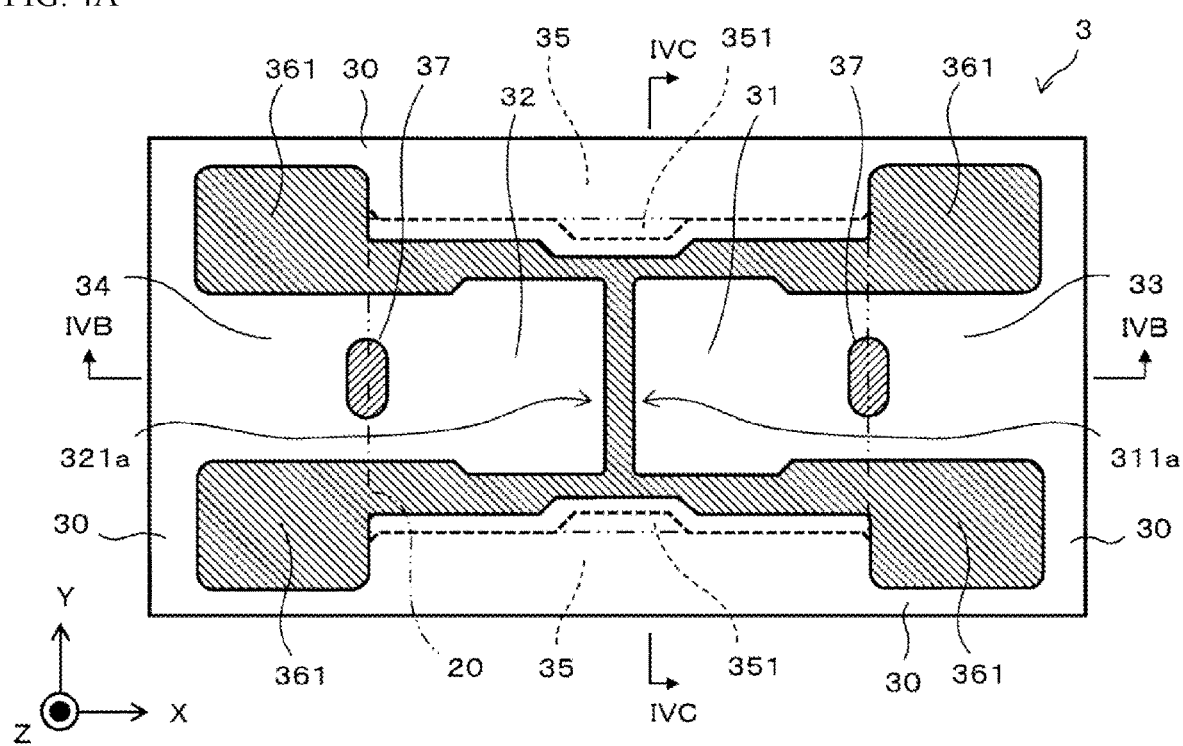
FIG. 4A is a plan view showing the structure of the lead frame formed in the first outline forming step of the method for producing the package of Embodiment 1.
Figure 4B:
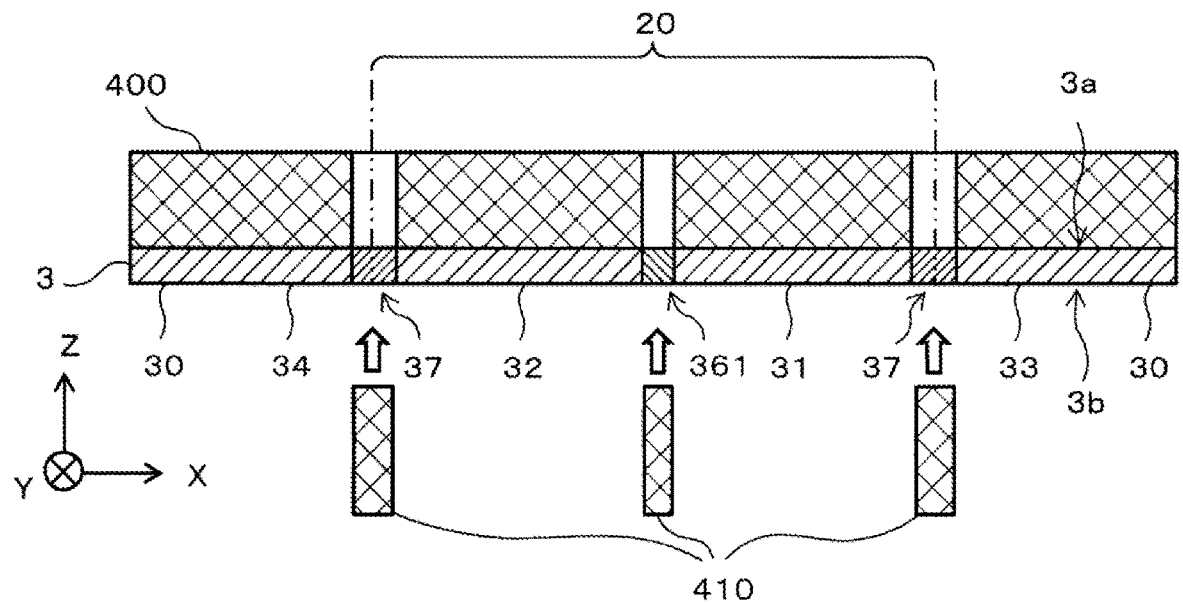
FIG. 4B is a sectional view along line IVB-IVB indicated in FIG. 4A showing the first outline forming step in the method for producing the package of Embodiment 1.
Figure 4C:
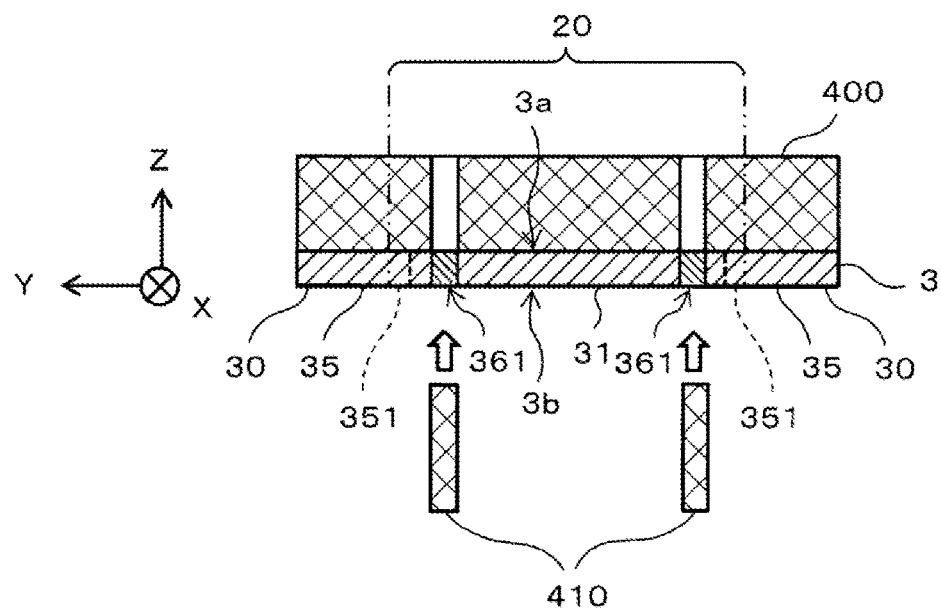
FIG. 4C is a sectional view along line IVC-IVC indicated in FIG. 4A showing the first outline forming step in the method for producing the package of Embodiment 1.
Figure 5A:
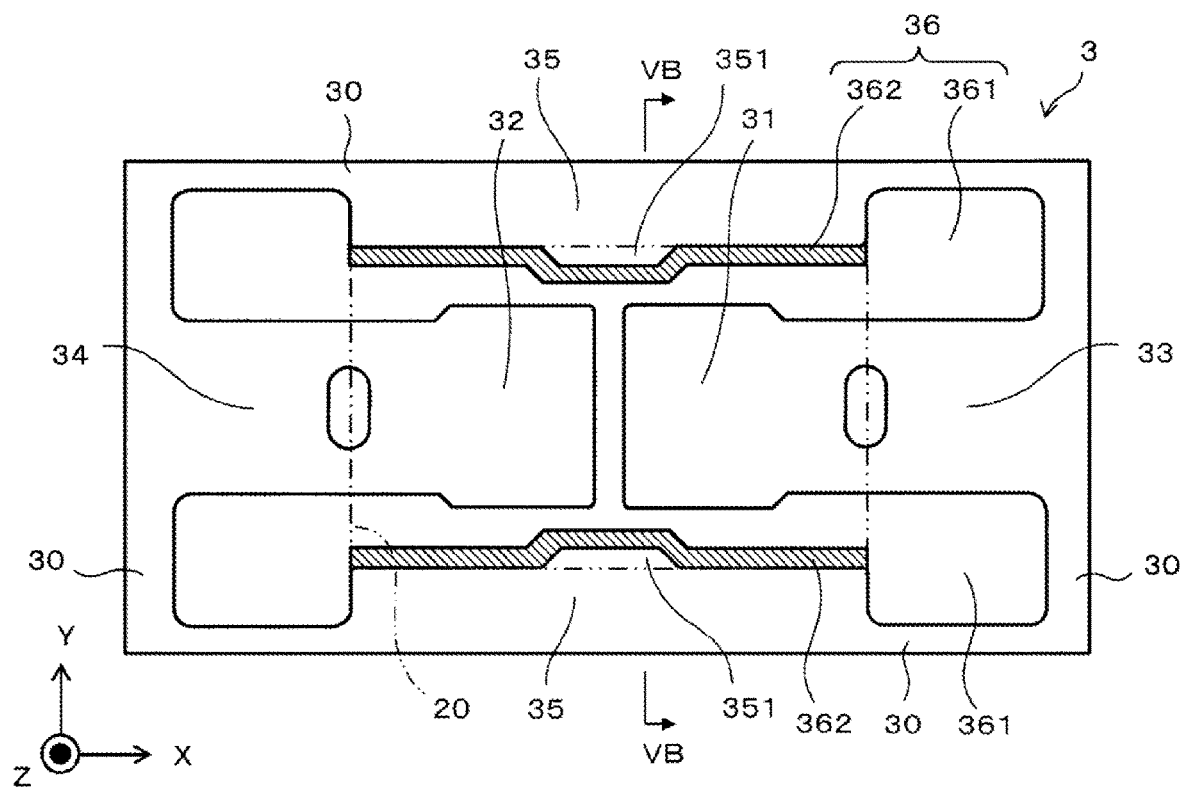
FIG. 5A is a plan view showing the structure of the lead frame formed in the second outline forming step of the method for producing the package of Embodiment 1.
Figure 5B:
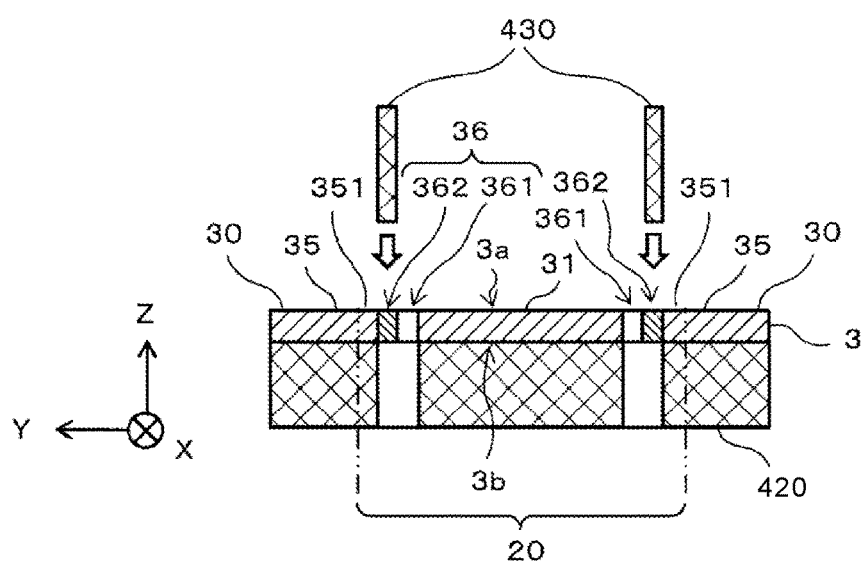
FIG. 5B is a sectional view along line VB-VB indicated in FIG. 5A showing the second outline forming step in the method for producing the package of Embodiment 1.
Figure 6A:
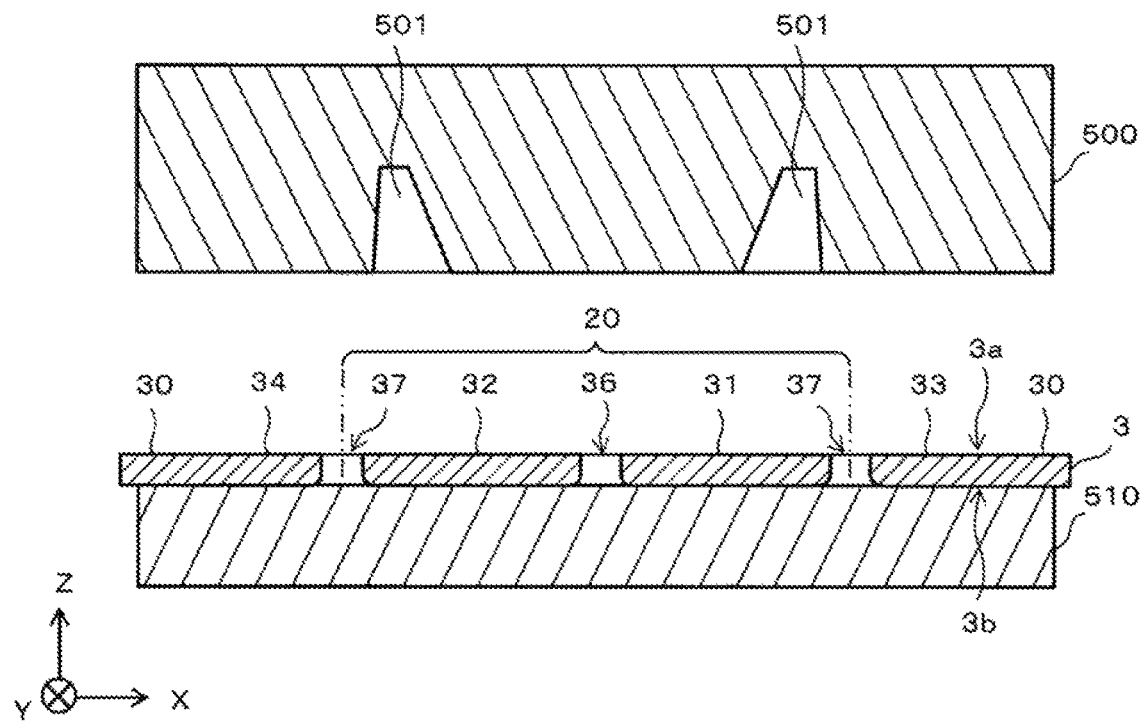
FIG. 6A is a sectional view showing the lead frame positioning step of the method for producing the package of Embodiment 1.
Figure 6B:
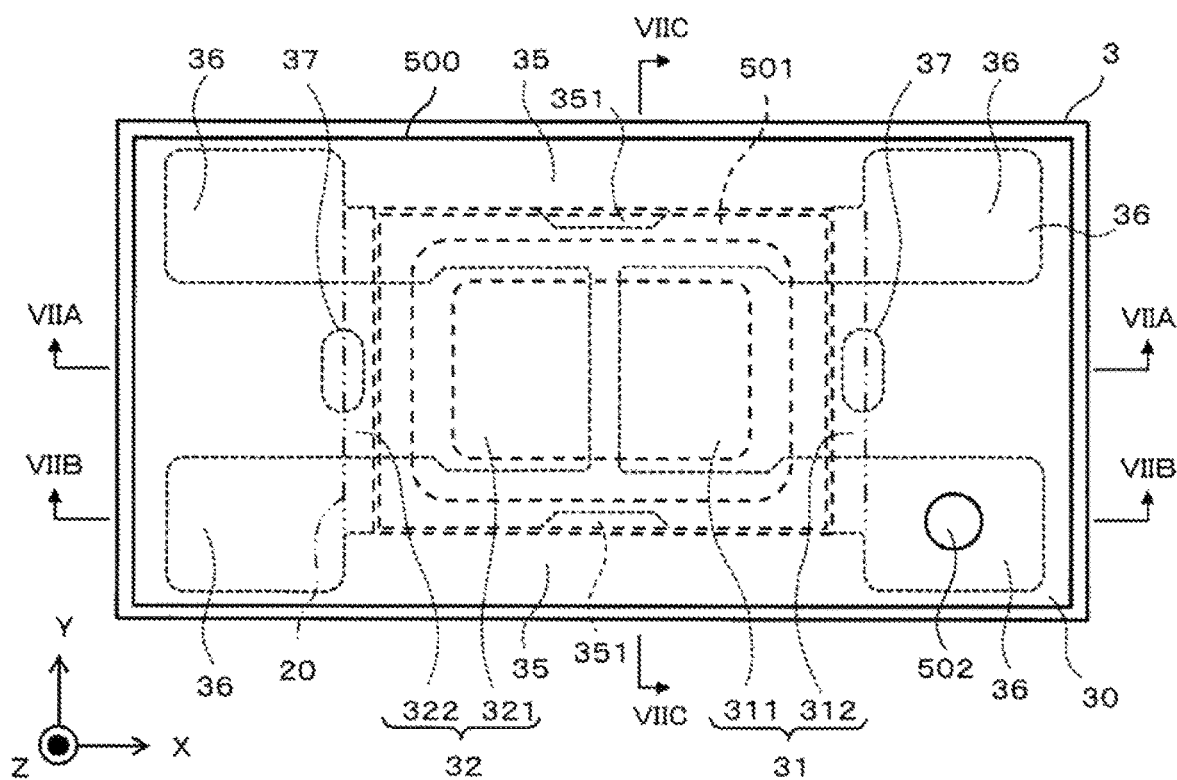
FIG. 6B is a plan view showing the lead frame positioning step of the method for producing the package of Embodiment 1.
Figure 7A:
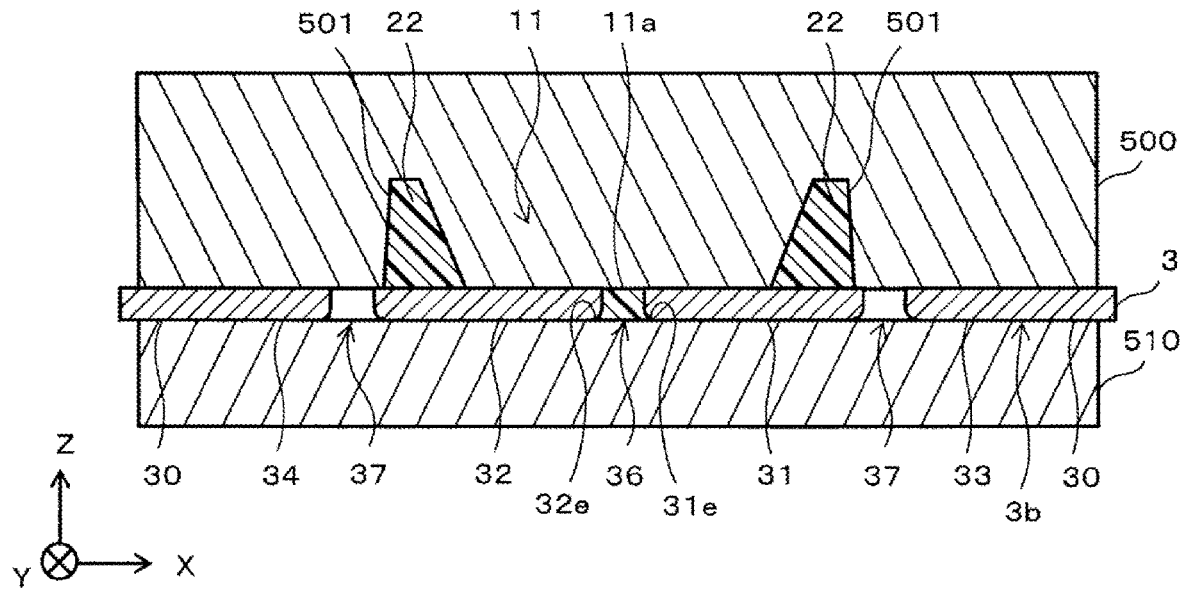
FIG. 7A is a sectional view along line VIIA-VIIA indicated in FIG. 6B showing the first resin injecting step in the support member forming step of the method for producing the package of Embodiment 1.
Figure 7B:
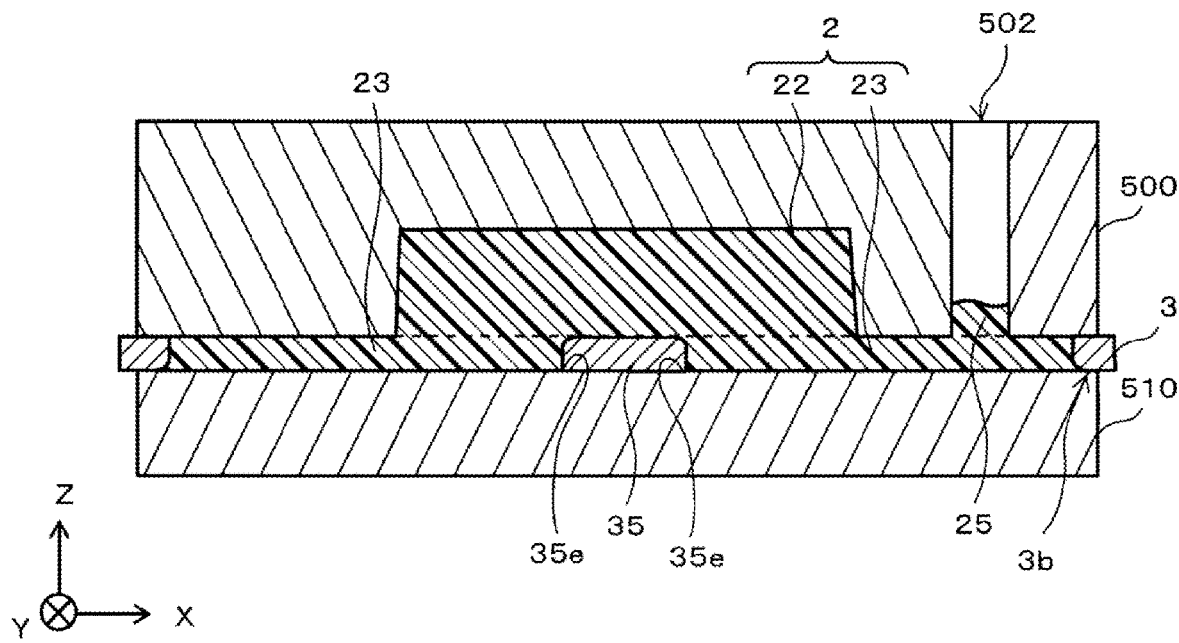
FIG. 7B is a sectional view along line VIIB-VIIB indicated in FIG. 6B showing the first resin injecting step in the support member forming step of the method for producing the package of Embodiment 1.
Figure 7C:
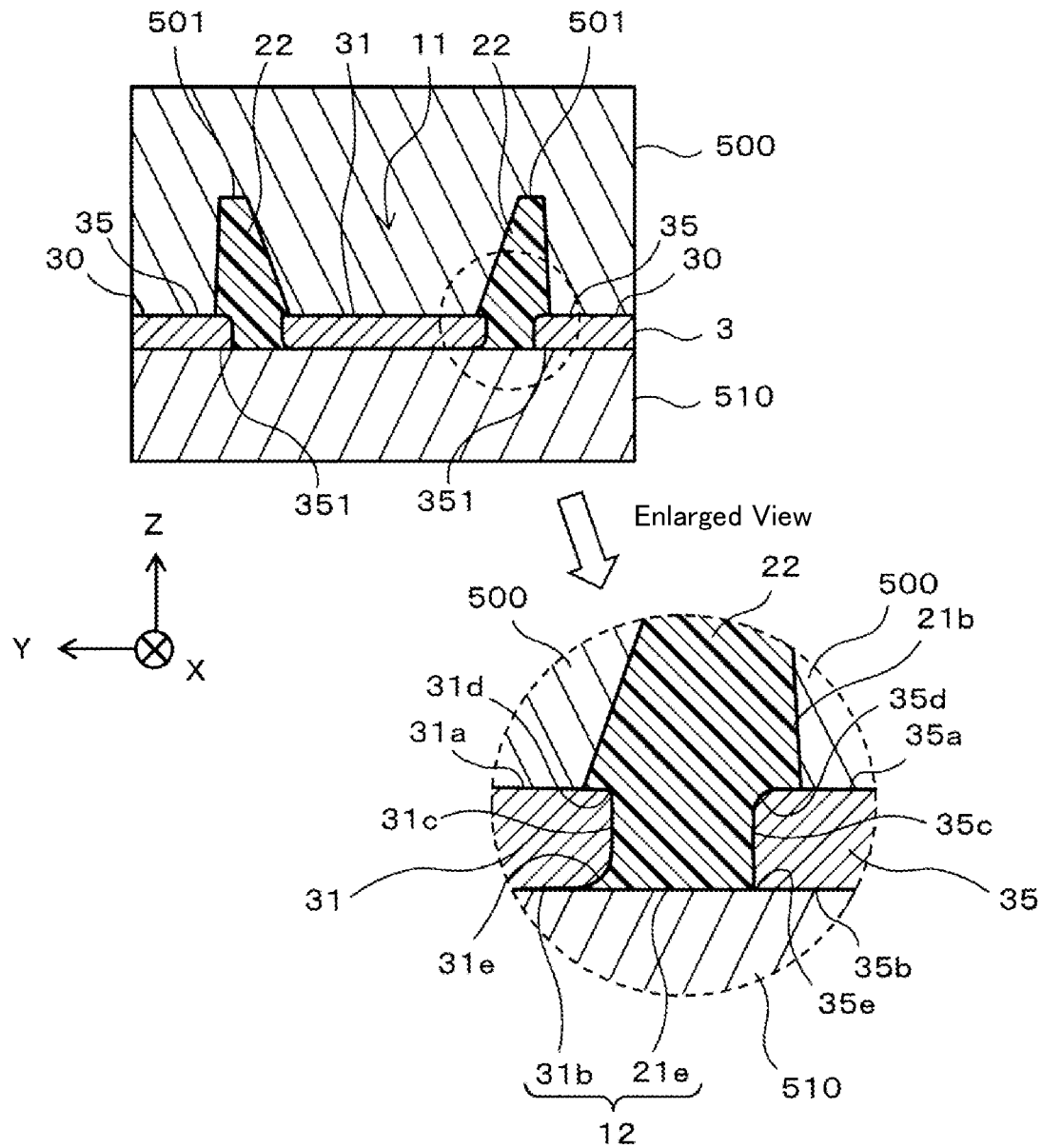
FIG. 7C is a sectional view along line VIIC-VIIC indicated in FIG. 6B showing the first resin injecting step in the support member forming step of the method for producing the package of Embodiment 1.
Figure 8:
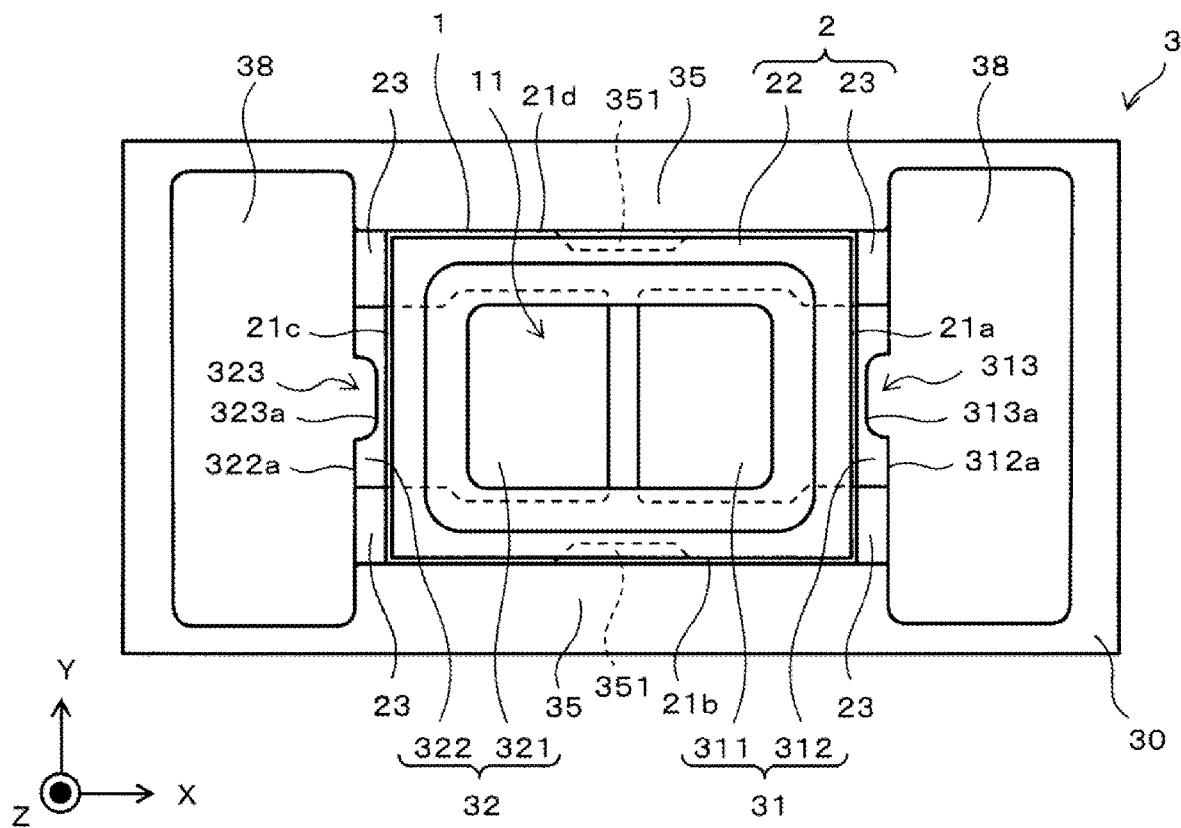
FIG. 8 is a plan view showing the electrode separating step of the method for producing the package of Embodiment 1.

The method for producing the package 1 will be explained next with reference to FIGS. 3-8. FIG. 3 is a flowchart showing the steps in the method for producing the package according to Embodiment 1. FIG. 4A is a plan view showing the lead frame structure formed in a first outline forming step in the method for producing the package according to Embodiment 1. FIG. 4B is a sectional view along line IVB-IVB indicated in FIG. 4A showing the first outline forming step in the method for producing the package according to Embodiment 1. FIG. 4C is a sectional view along line IVC-IVC indicated in FIG. 4A showing the first outline forming step in the method for producing the package according to Embodiment 1. FIG. 5A is a plan view showing the lead frame structure formed in a second outline forming step in the method for producing the package according to Embodiment 1. FIG. 5B is a sectional view along line VB-VB indicated in FIG. 5A showing the second outline forming step in the method for producing the package according to Embodiment 1. FIG. 6A is a sectional view showing a lead frame positioning step in the support member forming step of the method for producing the package according to Embodiment 1. FIG. 6B is a plan view showing the lead frame positioning step in the support member forming step of the method for producing the package according to Embodiment 1. FIG. 7A is a sectional view along line VIIA-VIIA indicated in FIG. 6B showing a first resin injecting step in the support member forming step of the method for producing the package according to Embodiment 1. FIG. 7B is a sectional view along line VIIB-VIIB indicated in FIG. 6B showing a first resin injecting step in the support member forming step of the method for producing the package according to Embodiment 1. FIG. 7C is a sectional view along line VIIC-VIIC indicated in FIG. 6B showing a first resin injecting step in the support member forming step of the method for producing the package according to Embodiment 1. FIG. 8 is a plan view showing an electrode separating step of the method for producing the package according to Embodiment 1.

FIG. 4A is a plan view, and the areas where through holes are created by press-punching in the first outline forming step are hatched. Moreover, in FIGS. 4B and 4C, the areas where through holes are created in the lead frame by press-punching in the first outline forming step are indicated by the same hatching as those shown in FIG. 4A.

FIG. 5A is also a plan view, and the areas where through holes are created by press-punching in the second outline forming step are hatched. Moreover, in FIG. 5B, the areas where through holes are created in the lead frame by press-punching in the second outline forming step are indicated by the same hatching as those shown in FIG. 5A.

FIG. 7C includes an enlarged view of the portion encircled by the dotted line partially showing an outer edge of the first electrode 31 and the tip 351 of the hanger lead 35.

The method for producing the package according to this embodiment includes a lead frame preparation step S110, a support member forming step S120, and an electrode separating step S130.

The lead frame preparation step S110 is a step of preparing a lead frame 3 which includes a first electrode 31, a second electrode 32, and hanger leads 35 by processing flat sheet metal. The lead frame preparation step S110 includes a first outline forming step S111, a second outline forming step S112, and a plating step S113.

The first outline forming step S111 is a step of forming the outlines of the first electrode 31, the second electrode 32, and other parts, excluding the outlines of the hanger leads 35 by press-punching or blanking flat sheet metal. For this purpose, the die 400 and the punch 410 used in press-punching have the blades shaped to match the through holes 361 for forming the outlines of the first electrode 31 and the second electrode 32, and the through holes 37 for forming the third recesses 313 and 323 provided at the end of the outer leads 312 and 322. The through holes 361 are formed so as to secure a certain width of sheet metal from the outline of the hanger leads 35 to allow for good press-punching to be performed in the second outline forming step S112. The through holes 37 are formed so as to straddle the outline of the planned formation area 20 for the support member 2.

In this step, press-punching is performed from the lower face 3b side by using a punch 410 so that the lower face 3b of the lead frame 3 becomes a dull face. This forms rounded outer edges on the lower face side of the first electrode 31 and the second electrode 32.

In this embodiment, the die 400 is situated on the upper side while situating the punch 410 on the lower side, but the die 400 may be situated on the lower side and the punch 410 on the upper side, or the die 400 and the punch 410 may be arranged sideways. Any configuration will be fine, so long as press-punching is performed using the punch 410 from the side that will be the lower face 3b of the lead frame 3.

For the sheet metal which is the raw material for the lead frame 3, any that is for use in lead frames for semiconductor element packages can be used. The thickness of the sheet metal can be appropriately selected in accordance with the package shape and size, and for example, a metal sheet of 100 to 500 µm in thickness is used, more preferably 120 to 300 µm in thickness. For the material for the metal sheet, a Cu alloy, for example, is used.

The second outline forming step S112 is a step of forming the outlines of the hanger leads 35 by press-punching the lead frame 3 in which the outlines of the first electrode 31 and the second electrode 32 have been formed by the first outline forming step S111. For this purpose, the die 420 and the punch 430 for use in press-punching have the blades shaped to match the through holes 362 for forming the outlines of the hanger leads 35.

The through holes 362 are communicated and integrated with the through holes 361 to form the through holes 36.

Press-punching (blanking or cutting) using the punch 430 is performed from upper face 3a side so that the upper face 3a becomes the dull face at the edges of the through holes 362. This forms rounded outer edges on the upper face side of the hanger leads 35.

Similar to the first outline forming step S111 described earlier, either the die 420 or the punch 430 may be situated on the lower side, or they may be configured sideways.

Either of the first outline forming step S111 and the second outline forming step S112 may precede the other. Moreover, the first outline forming step S111 and the second outline forming step S112 may be performed simultaneously with combination dies structured to press-punching from both sides of the upper face 3a and the lower face 3b of the lead frame 3 using punches 410 and 430, respectively.

It suffices for the lead frame 3 to have a dull lower face 3b at the outer edges of the first electrode 31 and the second electrode 32 that remain in the package 1 when completed, and a dull upper face 3a in the areas where the hanger leads 35 bite into the support member 2 and the adjacent areas. As for the remaining area, the lower face 3b can be a burred face or a dull face.

The lead frame 3 formed by this step is such that, in a plan view, the portions formed in the inner side of the planned formation area 20 for the support member 2 become the first electrode 31 and the second electrode 32. The end 311a of the first electrode 31 and the end 321a of the second electrode 32 oppose one another spaced apart at the center in the first direction, x-axis direction. The first electrode 31, in a plan view, is connected to the outer frame 30 via the connecting portion 33 which outwardly extends from one of the pair of short sides of the planned formation area 20 for the support member 2. The second electrode 32 is connected to the outer frame 30 via the connecting portion 34 which outwardly extends from the other of the pair of short sides of the planned formation area 20 for the support member 2.

The tips 351 of the two hanger leads 35 are opposing one another in the second direction, Y-axis direction, at the center in the first direction. The hanger leads 35, moreover, are positioned so that the tips 351 are on the inside of the pair of long sides of the planned formation area 20 for the support member 2 which is rectangular in a plan view, each outwardly extending from the long sides and connected to the outer frame 30.

The tips 351 are trapezoids in a plan view. The plan view shape of the tips 351 may be oblong in shape, but it is preferable to be tapered towards the inside of the planned formation area 20 for the support member 2. The size of the trapezoid shape for the tips 351 is not particularly limited, and for example, the upper base can be set to 400-500 µm, the lower base 500-700 µm, and the height 50-150 µm. The plan view shape of the tips 351 may alternatively be semi-spherical, triangular, or the like. The two tips 351 are positioned so as to bite into a pair of outer lateral faces of the support member 2 in order to support the package 1 on the lead frame 3, but by providing a tapered shape, an application of an appropriate external force can detach the tips 351 of the hanger leads 35 from the support member 2.

The case of producing a single package 1 will be explained, but the packages 1 can be produced in a one- or two-dimensional array. In that case, it suffices to form, for example, an aggregate of lead frames continuously arranging the lead frame 3 shown in FIG. 4A in a one- or two-dimensional array.

The plating step S113 is a step of applying Ag electroplating or the like on the surface of the lead frame 3 in order to improve the light reflectance or/and solder bonding. In this step, the upper face and the lower face of the lead frame 3, and the lateral faces, including the inner lateral faces of the through holes 36 and 37, are plated.

In lieu of the plating step S113, using a sheet metal whose surface has been plated can be used as the raw material for the lead frame 3 to perform the first outline forming step S111 and the second outline forming step S112.

The support member forming step S120 is a step of molding the support member 2 using a first resin to support the first electrode 31 and the second electrode 32 of the lead frame 3. The support member forming step S120 includes a lead frame positioning step S121, a first resin injecting step S122, and a first resin solidifying or curing step S123.

For the resin material, the first resin, for forming the support member 2, the aforementioned thermoplastic resins and thermosetting resins can be used. The support member 2 can be formed by injection molding if a thermoplastic resin, such as a polyphthalamide resin, is used for the resin material, and by transfer molding if a thermosetting resin, such as an epoxy resin, is used.

The lead frame positioning step S121 is a step to interpose the lead frame 3 between the upper die 500 and the lower die 510 of the molding die. The upper die 500 has a hollow 501 corresponding to the shape of the walls 22 of the support member 2, and the flat portion adjacent to the hollow 501. The hollow 501 is a ring shape in a plan view.

The lead frame 3 is aligned so that the wall formation area 20a of the planned formation area 20 for the support member 2 coincides with the outline of the hollow 501 of the upper die 500, and the through holes 37 are on the outer side of the hollow 501 in a plan view.

The upper die 500 is provided with a gate 502 for injecting the first resin which is located in the area where the through holes 36 of the lead frame 3 are provided, and on the outside of the planned formation area 20 for the support member 2 in a plan view when aligned with the lead frame 3.

The lower die 510 has a flat upper face. The lower face 3b of the lead frame 3 is flat in its entirety. Accordingly, interposing the lead frame 3 between the lower die 510 and the upper die 500 makes the lower faces 31b and 32b of the first electrode 31 and the second electrode 32 coplanar with the lower faces 35b of the hanger leads 35. Furthermore, since the upper face of the lower die 510 is flat, the lower face 21e which is the lower end face of the support member 2 also becomes coplanar with the lower faces 31b, 32b, and 35b.

The first electrode 31, the second electrode 32, and the hanger leads 35 may have non-flat portions by bending in some region. In this case, it suffices for the lower end portions of the lower face 31b, 32b, and 35b to be formed coplanar with the lower face 21e which is the lower end face of the support member 2.

The first resin injection step S122 is a step of injecting a first resin inside the molding die from the gate 502 while the lead frame 3 is interposed between the upper die 500 and the lower die 510.

Here, the gate 502, through holes 36, and hollow 501 are communicated with one another, but the through holes 37 are not communicated with these spaces. Accordingly, the first resin is injected into the through holes 36 and the hollow 501, but not into the through holes 37.

The first resin penetrates between the upper face of the lower die 510 and the rounded lower face corners 31e and 32e of the first electrode 31 and the second electrode 32, however, does not penetrate between the upper face of the lower die 510 and the lower face corners 35e of the hanger leads 35 which are not rounded. Thus, no burrs will be formed at the lower ends of the second recesses 24 formed after removing the hanger leads 35 in the separation step S240 described later.

The first resin solidifying or curing step S123 is a step of solidifying or curing the resin injected into the molding die.

Here, in the case of using a thermoplastic resin as the resin material, solidifying the heated molten thermoplastic resin by cooling is referred to as "solidifying." In the case of using a thermosetting resin as the resin material, solidifying the liquid thermosetting resin by heating is referred to as "curing."

By solidifying or curing the first resin filling the hollow 501 of the upper die 500 and the through holes 36 of the lead frame 3, the walls 22 are formed in the hollow 501, and the collars 23 are formed in the through holes 36. The collars 23 are formed in the through holes 36 so that the molding made of the first resin continuously extends to the areas outside the planned formation area 20 for the support member 2 in a plan view. The first electrode 31 and the second electrode 32 of the lead frame 3 are firmly supported by the support member 2 which has the walls 22 and the collars 23. The support member 2, which is parallelepiped, is placed so that the tips 351 of the two hanger leads 35 bite into the pair of opposing faces, the second outer lateral face 21b and the fourth outer lateral face 21d.

Accordingly, the package 1, which is composed of the support member 2 formed in this step, the first electrode 31, and the second electrode 32, is connected to the outer frame 30 of the lead frame 3 by the connecting portions 33 and 34, and hanger leads 35.

The first resin remaining in the gate 502 is solidified to form a gate mark 25.

The electrode separation step S130 is a step of separating the first electrode 31 and the second electrode 32 from the lead frame 3. This step can be performed by forming through holes 38 by press-punching, or blanking, the connecting portions 33 and 34 which attach the first electrode 31 and the second electrode 32 to the lead frame 3. The press-punching forms the through holes 38 whose border lines on the package 1 side coincide with the outer lines of the planned formation area 20 for the support member 2. At this time, the connecting portions 33 and 34 together with the extended portions of the first resin formed continuously to the collars 23 in the through holes 36 are removed. Furthermore, the gate mark 25 formed in the extended portion is also removed. Accordingly, the package 1 when completed has no gate mark 25. This allows for the package 1 to be formed thin.

Since the electrode separation step S130 is a step to form the outlines of the outer leads 312 and 322 of the first electrode 31 and the second electrode 32, press-punching is performed using a punch from the lower face 3b side of the lead frame 3 so as not to generate burrs on the lower faces 31b and 32b, which form the mounting face.

The formation of the through holes 38 causes a portion of each of the through holes 37 which have been formed to straddle the outer lines of the planned formation area 20 of the support member 2 to result in the third recesses 313 and 323 of the outer leads 312 and 322 of the first electrode 31 and the second electrode 32.

Here, the end faces 312a and 323a of the outer leads 312 and 322 formed by the through holes 38 are the exposed surfaces of the sheet metal material of the lead frame 3, but since the lateral faces 313a and 323a of the third recesses 313 and 323 are plated, they have good solder wettability. For this reason, when the package 1 is solder bonded using the lower faces 31b and 32b of the first electrode 31 and the second electrode 32 as the mounting face, the solder fillets formed on the lateral faces 313a and 323a can increase the bonding strength.

As described earlier, moreover, whether solder bonding is good or not can be determined by checking the presence or absence of the solder fillets.

The first electrode 31 and the second electrode 32 are separated from the lead frame 3 by this step, but the package 1 is supported by the hanger leads 35 and is connected to the lead frame 3. The package 1 can be detached from the lead frame 3 by pushing the package 1 from the lower face side to the upper face side, or in +Z-axis direction, out of the lead frame 3.

In this embodiment, moreover, the first electrode 31 and the second electrode 32 were separated from the lead frame 3 by forming the through holes 38 by press-punching, but the method is not limited to this. For example, they can be cut along the outline of the planned formation area 20 for the support member 2 using a lead cutter.

In this embodiment, since the first electrode 31 and the second electrode 32, as well as the hanger leads 35, are arranged with good symmetry, bias in the stress applied to the first electrode 31 and the second electrode 32 can be reduced when the package 1 is separated from the lead frame 3. As a result, the first electrode 31 and the second electrode 32 are less vulnerable to deformation or separation from the support member 2.

Forming the upper end inner corners of the second recesses 24, which have appeared after detaching the tips 351 of the hanger leads 35, to be rounded makes the support member 2 less vulnerable to cracking or breaking within the second recesses 24.

Other Variations

In this embodiment, the support member 2 is oblong in shape in a plan view, but may have a circular, elliptical, or any other polygonal shape.

The total number of the tips 351 of the hanger leads 35 that bite into the second outer lateral face 21b and the fourth outer lateral face 21d of the support member 2 may be three or more. Furthermore, in lieu of, or in addition to these, the hanger leads 35 may be disposed to bite into the first outer lateral face 21a or/and the third outer lateral face 21c. The locations thereof are not limited to the central portions of the outer lateral faces, and can alternatively be disposed at the corner portions.

The first electrode 31 and the second electrode 32 may be configured so as not to have line symmetry in which either one is larger than the other.

In this embodiment, moreover, the lower faces 31b and 32b of the first electrode 31 and the second electrode 32 are formed flat and coplanar with one another, but a portion can be configured higher than the lower end face of the package 1 by performing bending or the like. In this case, the outer edges of the area that is configured higher than the lower end face of the package 1 do not need to be rounded. In other words, since this area does not come into contact with the mounting substrate even if burrs are formed, press-punching can be performed while orienting the lower face 31b as a burred face.

Light Emitting Device Structure

Figure 9:
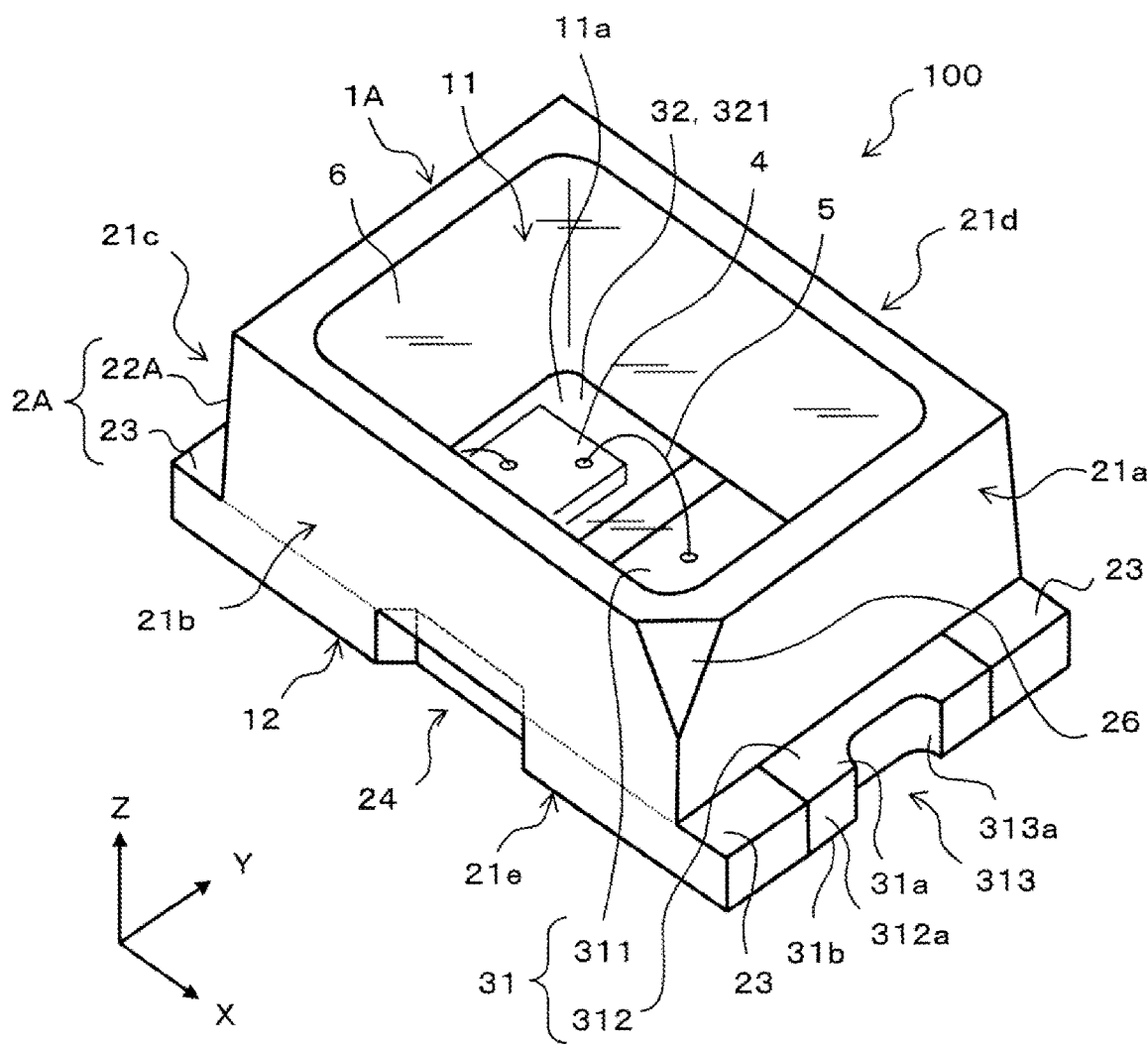
FIG. 9 is a perspective view showing the structure of the light emitting device according to Embodiment 1.

Next, the structure of the light emitting device using the package according to Embodiment 1 will be explained with reference to FIG. 9. FIG. 9 is a perspective view showing the structure of the light emitting device according to Embodiment 1.

The light emitting device 100 of Embodiment 1 includes a package 1A, a light emitting element 4 mounted in the first recess 11 of the package 1A, and a sealing member (a second resin) 6 covering the light emitting element 4. In this embodiment, the light emitting element 4 is electrically connected to the first electrode 31 and the second electrode 32 using a wire 5.

The package 1A differs from the package 1 described earlier by having walls 22A, in lieu of the walls 22, which include a marking 26 for the polarity of the first electrode 31 created by cutting off or indenting a peak of the substantially parallelepiped outline. The shape, size, and the location of the marking 26 are not particularly limited, and it can also be provided on the second electrode 32 side, for example. Moreover, the package 1 which does not have the marking 26 may be used instead of the package 1A.

The package 1A is otherwise constructed in a similar manner to in the case of package 1, and thus the detailed explanation will be omitted.

The light emitting element 4 is mounted on the second electrode 32 of the package 1A. The light emitting element 4 used here is not particularly limited in terms of the shape, the size, or the semiconductor material. For the emission color of the light emitting element 4, any wavelength can be selected in accordance with the application. A light emitting element made of a nitride semiconductor represented by $In_XAl_YGa_{1-X-Y}N$ ($0 \leq X \leq 1$, $0 \leq Y \leq 1$, $X+Y \leq 1$) having a wavelength in the range from the near ultraviolet to the visible light region can suitably be used.

In this embodiment, the light emitting element 4 is of a face-up type in which both the positive and negative electrodes are arranged on the same face, but can be of a face-down type in which the positive and negative electrodes are arranged on opposing faces.

The wire 5 is a conductive wire for electrically connecting the electronic components, such as the light emitting element 4 and protective element to the first electrode 31 and the second electrode 32. Examples for the wire 5 include metals such as Au (gold), Ag (silver), Cu (copper), Pt (platinum), and Al (aluminum), as well as the alloys thereof, but it is particularly preferable to use Au which has high thermal conductivity. The size of the wire 5 is not particularly limited, and any size can be appropriately selected in accordance with the purpose and application.

The sealing member (the second resin) 6 covers the light emitting element 4 mounted in the first recess 11 of the package 1A. The sealing member 6 is provided to protect the light emitting element 4 from external forces, dust, and moisture, as well as achieving good heat resistance, weather resistance and light resistance of the light emitting element 4. For the sealing member 6, a transparent material such as thermosetting resins, for example, silicone resins, epoxy resins, and urea resins can be used. In order to impart a certain function, a phosphor (a wavelength converting substance), light reflecting substance, light diffusing substance, and other fillers may be added to these materials.

By having the sealing member 6 contain phosphor particles, for example, the color tone adjustment of the light emitting device 100 can be facilitated. A phosphor which has a greater specific gravity than that of the sealing member 6, absorbs and converts the light from the light emitting element 4 can be used. The phosphor, given the greater specific gravity than that of the sealing member 6, can settle and be positioned near the surfaces of the first electrode 31, the second electrode 32 and the light emitting element 4.

Specific examples include yellow phosphors, such as, YAG ($Y_3Al_5O_{12}$:Ce), silicate, and the like, and red phosphors, such as CASN ($CaAlSiN_3$:Eu), KSF ($K_2SiF_6$:Mn), and the like.

As for the fillers that the sealing member 6 can contain, for example, particles of $SiO_2$, $TiO_2$, $Al_2O_3$, $ZrO_2$, MgO, and the like, can suitably be used. For the purpose of eliminating the light of unwanted wavelengths, an organic or inorganic pigment or dye may also be used.

Method for Producing Light Emitting Device

Figure 10:
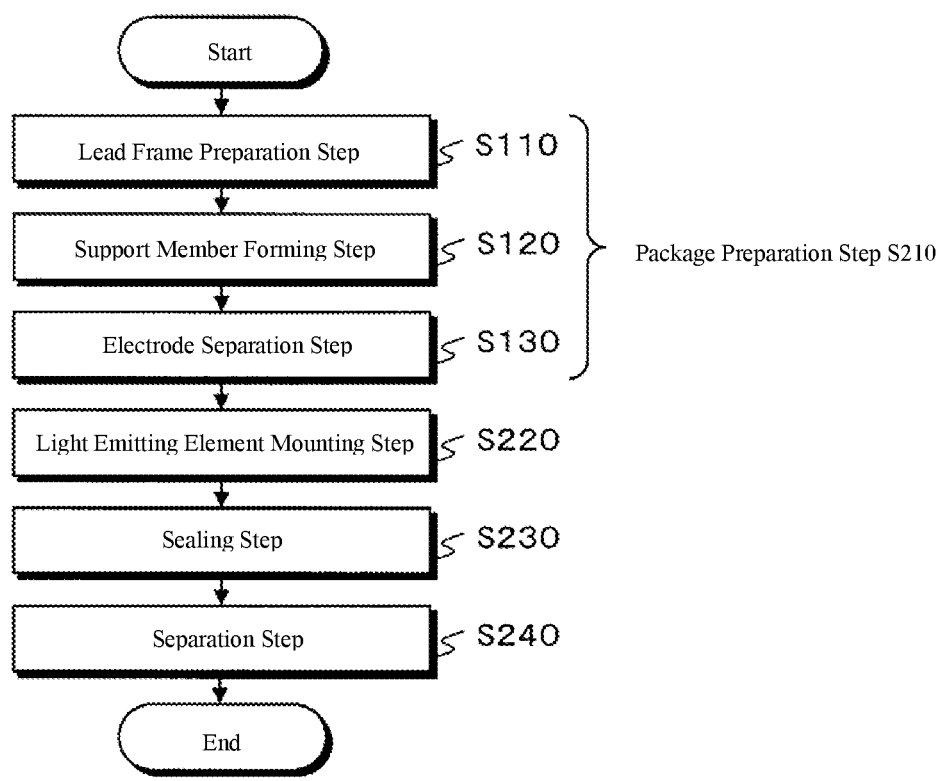
FIG. 10 is a flowchart showing the steps of the method for producing the light emitting device according to Embodiment 1.
Figure 11A:
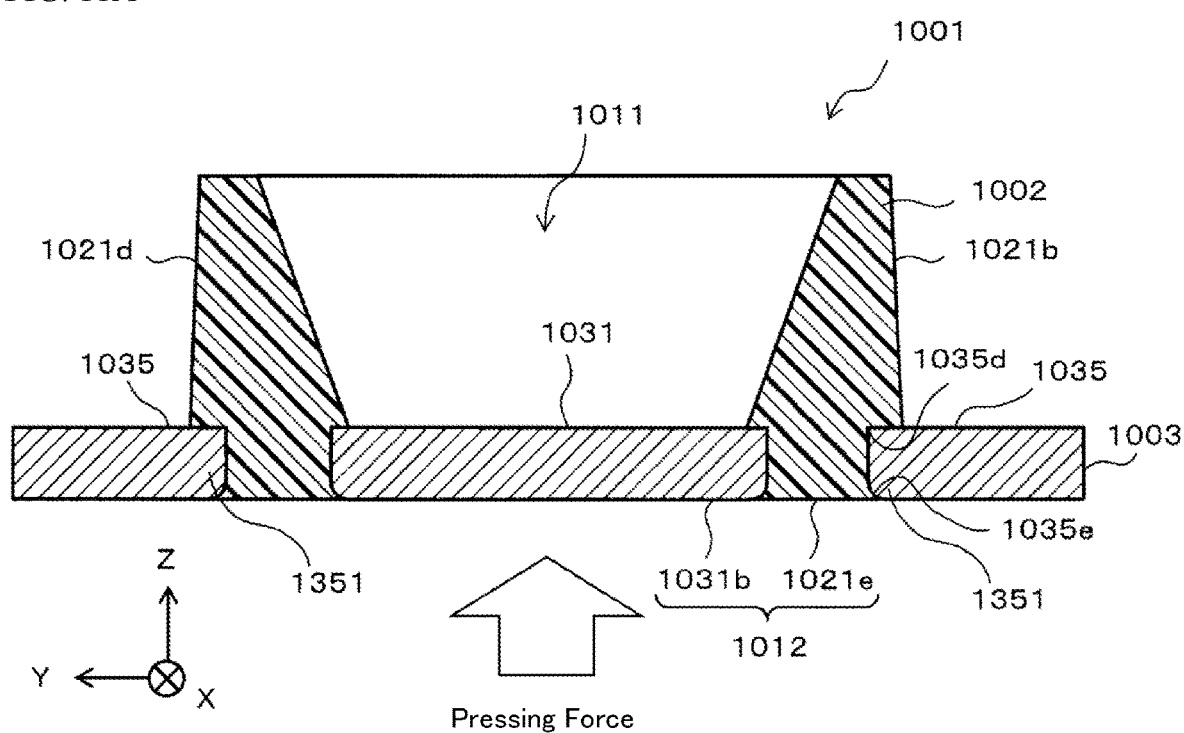
FIG. 11A is a sectional view showing the structure of a comparative package supported by hanger leads.
Figure 11B:
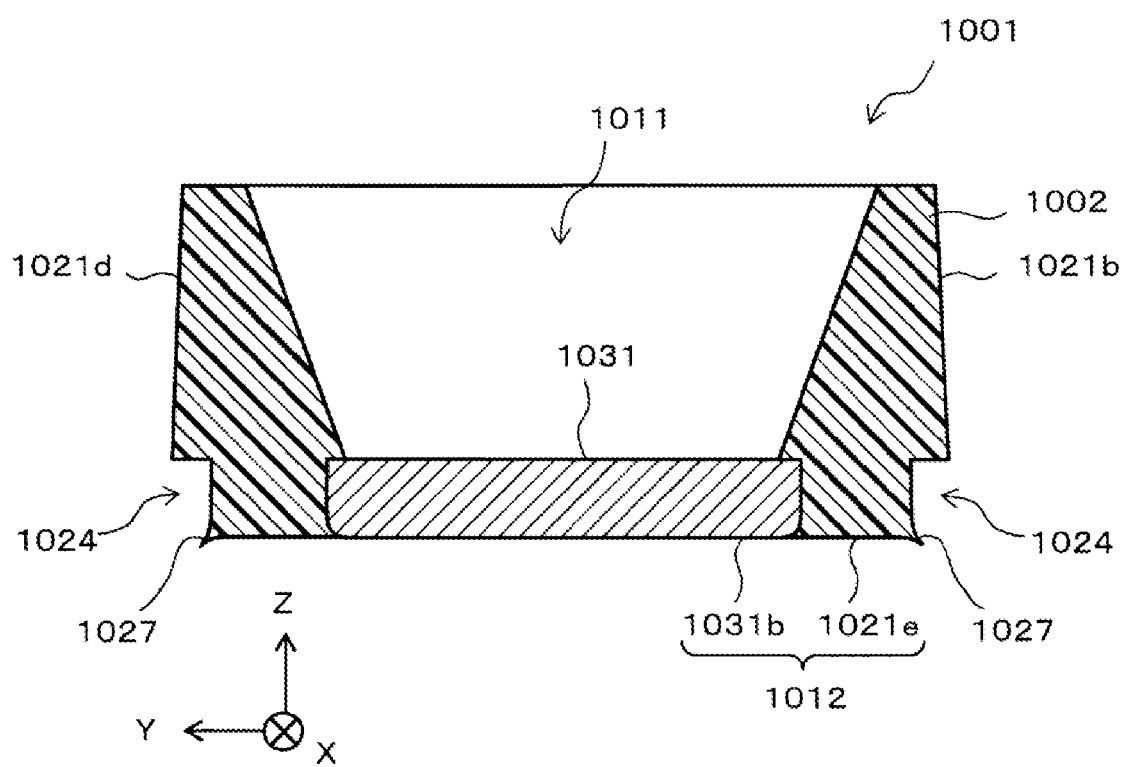
FIG. 11B is a sectional view showing the structure of a comparative package separated from hanger leads.

Next, the method for producing the light emitting device using the package of Embodiment 1 will be explained with reference to FIGS. 9 and 10. FIG. 10 is a flowchart showing the steps in the method for producing the light emitting device of Embodiment 1.

The method for producing the light emitting device according to this embodiment includes a package preparation step 5210, a light emitting element mounting step 5220, a sealing step 5230, and a separation step 5240.

The package preparation step 5210 includes a lead frame preparation step S110, a support member forming step 5120, and an electrode separation step 5130. The package preparation step 5210 performs the production method for the package described earlier, and thus the detailed explanation will be omitted.

The light emitting element mounting step 5220 is a step for mounting a light emitting element 4 in the first recess 11 of the package 1A.

In this embodiment, the light emitting element 4 is of a single-sided electrode structure in which the n-side electrode and the p-side electrode are formed on the upper face side, and is mounted face up. Accordingly, the lower face of the light emitting element 4 is bonded to the upper face of the second electrode 32 using an insulating die bonding member. The n-side electrode and the p-side electrode of the light emitting element 4 are connected to the upper faces of the first electrode 31 and the second electrode 32 of the corresponding polarity using wires 5.

In this embodiment, the light emitting element 4 is of a face-up type in which the positive and negative electrodes are arranged on the same face, but may be of a face-down mounting or flip chip type in which the positive and negative electrodes are arranged on different faces.

The sealing step 5230 is a step for covering the light emitting element 4, the protective element, and the wires 5 installed in the first recess 11 with a sealing member 6.

This step is performed by applying the sealing member 6 inside the first recess 11. As a method for applying the sealing member 6, potting can suitably be used. The sealing member 6 can be formed by filling the first recess 11 with a liquid resin material, and solidifying or curing it. Potting is preferable because the air remaining in the first recess 11 can be effectively evacuated. For the method for filling the first recess 11 with the sealing member 6, various printing methods and resin molding methods can also be used.

The separation step S240 is a step of separating the light emitting device 100 attached to the outer frame 30 of the lead frame 3 into an individual piece by detaching it from the hanger leads 35.

As described earlier, by pushing the package 1 from the lower face side to the upper face side, i.e., in the +Z direction, out of the lead frame 3, the package 1 can be separated from the lead frame 3.

The light emitting device 100 can be produced by performing each of the steps described above.

The method may be adapted to perform the light emitting element mounting step S220 and the sealing step S230 between the support member forming step S120 and the electrode separation step S130 of the package preparation step S210. In other words, the light emitting device 100 can be separated into an individual piece after mounting and sealing the light emitting element 4 while the package 1A remains unseparated by being firmly attached to the lead frame 3 using the connecting portions 33 and 34 in addition to the hanger leads 35.

Alternatively, the light emitting element mounting step S220 and the sealing step S230 may be performed after the electrode separation step S130 and the separation step S240. In other words, the light emitting element 4 can be mounted and sealed after package 1A is separated into an individual piece.

In addition, the order of the steps can be changed so as to conform to the conditions described below.

As for the electrode separation step S130, it is fine as long as it is performed before the separation step S240. Accordingly, the electrode separation step S130 may be performed after the light emitting element mounting step S220 and the sealing step S230, or between the light emitting element mounting step S220 and the sealing step S230.

As for the light emitting element mounting step S220, it is fine as long as it is performed after the support member forming step S120 of the package preparation step S210, but before the sealing step S230. Accordingly, the light emitting element mounting step S220 may be performed after the electrode separation step S130. Moreover, the light emitting element mounting step S220 may be performed after the separation step S240.

As for the sealing step S230, it is fine as long as it is performed after the light emitting element mounting step S220. Accordingly, the sealing step S230 may be performed after the electrode separation step S130 and the separation step S240.

EXAMPLES

The light emitting device shown in FIG. 9 was produced using the aforementioned production method under the conditions described below.

A Cu sheet metal with Ag plating on the surface was used as the raw material for the lead frame.

A polyphthalamide resin was used as the raw material for the support member which was formed by injection molding.

Moreover, titanium oxide particles were added to the support member resin material to bring the reflectance of the inner surfaces of the first recess of the support member to at least 70%. The reflectance is based on the value at the emission peak wavelength of the light emitting element as a reference.

The package outline is a box shape of about 2.2 mm in length, about 1.4 mm in width, and about 0.7 mm in height. The wall thickness is in a range of about 0.12 mm and 0.30 mm. The thickness of the lead frame and the thickness of the collars is about 0.2 mm. The hanger leads are substantially trapezoids in a plan view with an upper base of about 0.4 mm, a lower base connected to the outer frame of about 0.66 mm, and a height from the upper base to the lower base of about 0.05 mm. The third recess is substantially semi-oval shaped in a plan view with a long diameter of about 0.30 mm and a short diameter of about 0.05 mm.

For the light emitting element, a nitride-based blue light emitting diode having an emission peak in the vicinity of 460 nm was used.

A silicone resin is used for the sealing member.

After installing the light emitting element in the package, the first electrode and the second electrode were cut from the outer frame by press punching. At this time, the package was supported by the hanger leads. Subsequently, the light emitting device was separated by applying a pressing force from the lower face side of the package to be detached from the hanger leads.

The separated light emitting device (package) had a flat lower face which is the mounting face free of resin burrs.

The light emitting device according to certain embodiments of the present disclosure can be utilized in lighting devices, automotive light emitting devices, and the like.

Obviously, numerous modifications and variations of the present invention are possible in light of the above teachings. It is therefore to be understood that within the scope of the appended claims, the invention may be practiced otherwise than as specifically described herein.

What is claimed is:

1. A method for producing a lead frame, the method comprising:
press-punching a metal sheet to form the lead frame such that a radius of curvature at a corner of a lower face of each of electrodes is larger than a radius of curvature at a corner of an upper face of each of the electrodes while a radius of curvature at a corner of a lower face of each of hanger leads is smaller than a radius of curvature at a corner of an upper face of each of the hanger leads, the lead frame including the electrodes, the hanger leads spaced apart from the electrodes, and an outer frame attached to the electrodes and the hanger leads, the lead frame partially defining a box-shaped package, which has a first recess for mounting a light emitting element, as combined with a support member made of a resin for supporting the electrodes, the first recess having an opening defining by lateral walls formed by the support member and a bottom face at least partially formed by the electrodes.

2. The method for producing the lead frame according to claim 1, wherein
the press-punching of the metal sheet includes press-punching the metal sheet to form the lead frame such that the corner of the lower face of each of the electrodes is rounded while the corner of the upper face of each of the electrodes is not rounded, and the corner of the lower face of each of the hanger leads is not rounded while the corner of the upper face of each of the hanger leads is rounded.

3. The method for producing the lead frame according to claim 1, wherein
the press-punching of the metal sheet includes punching perimeters of the electrodes and punching perimeters of the hanger leads.

4. The method for producing the lead frame according to claim 3, wherein
a direction of punching the perimeters of the electrodes and a direction of punching the perimeters of the hanger leads are opposite one another.

5. The method for producing the lead frame according to claim 3, wherein
a direction of punching the perimeters of the hanger leads is a direction from the upper face to the lower face of each of the hanger leads when the package is formed.

6. A method for producing a package comprising:
forming the lead frame by the method according to claim 1;
interposing the lead frame between an upper die and a lower die of a molding die, which are configured to move in an up-down motion and has a cavity for forming the lateral walls;
injecting a first resin into the molding die interposing the lead frame; and
curing or solidifying the first resin injected in the molding die, wherein
during the interposing of the lead frame, burred faces of the electrodes face the cavity, edges of the electrodes are placed in an area where the cavity is disposed in a plan view, and tips of the hanger leads are placed in the area where the cavity is disposed in the plan view.

7. A method for producing a light emitting device comprising:
forming the package by the method according to claim 6; and
mounting the light emitting element in the first recess of the package.

8. The method for producing the light emitting device according to claim 7, further comprising
separating the device into an individual piece by pushing out the package from a lower face side to an upper face side of the package; and
cutting the electrodes from the outer frame after the separating of the device.

9. The method for producing the light emitting device according to claim 7, further comprising
sealing the light emitting element by applying a second resin inside the first recess after the mounting of the light emitting element.

10. The method for producing the light emitting device according to claim 8, further comprising
sealing the light emitting element by applying a second resin inside the first recess after the mounting of the light emitting element.

* * * * *